US012684833B2

(12) United States Patent
Lee et al.

(10) Patent No.: US 12,684,833 B2
(45) Date of Patent: Jul. 14, 2026

(54) SEMICONDUCTOR DEVICE

(71) Applicant: SAMSUNG ELECTRONICS CO., LTD., Suwon-si (KR)

(72) Inventors: Ho Jin Lee, Hwaseong-si (KR); Beom Jin Park, Hwaseong-si (KR); Myoung Sun Lee, Seoul (KR); Keun Hwi Cho, Seoul (KR); Dong Won Kim, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 775 days.

(21) Appl. No.: 17/888,639

(22) Filed: Aug. 16, 2022

(65) Prior Publication Data

US 2023/0170386 A1 Jun. 1, 2023

(30) Foreign Application Priority Data

Dec. 1, 2021 (KR) ........................ 10-2021-0170080

(51) Int. Cl.
| | |
|---|---|
| *H10D 62/10* | (2025.01) |
| *H10D 30/43* | (2025.01) |
| *H10D 30/67* | (2025.01) |
| *H10D 64/01* | (2025.01) |

(52) U.S. Cl.
CPC .......... *H10D 62/121* (2025.01); *H10D 30/43* (2025.01); *H10D 30/6757* (2025.01); *H10D 64/021* (2025.01)

(58) Field of Classification Search
CPC ........... H10D 84/0188; H10D 30/6735; H10D 30/501; H10D 62/121; H10D 30/43; H10D 84/0193; H10D 30/795; H10D 84/832
See application file for complete search history.

(56) References Cited

U.S. PATENT DOCUMENTS

| | | | |
|---|---|---|---|
| 9,412,616 | B1 | 8/2016 | Xie et al. |
| 9,773,785 | B2 | 9/2017 | Chang et al. |
| 9,865,704 | B2 | 1/2018 | Xie et al. |
| 10,679,994 | B1 | 6/2020 | Yang |
| 10,818,791 | B2 | 10/2020 | Cheng |

(Continued)

FOREIGN PATENT DOCUMENTS

| | | |
|---|---|---|
| KR | 1020150061698 A | 6/2015 |
| KR | 1020150118878 A | 10/2015 |
| KR | 1020150128104 A | 11/2015 |

*Primary Examiner* — Alia Sabur
(74) *Attorney, Agent, or Firm* — Muir Patent Law, PLLC

(57) ABSTRACT

A semiconductor device includes first to fourth active patterns extending in a horizontal first direction. The second active pattern is spaced apart from the first active pattern in the first direction. The third active pattern is spaced apart from the first active pattern in a horizontal second direction. The fourth active pattern is spaced apart from the third active pattern in the first direction. A field insulating layer surrounds a sidewall of each of the first to fourth active patterns. First to fourth pluralities of nanosheets are respectively disposed the first to fourth active patterns. A first gate electrode extends in the second direction, intersects each of the first and third active patterns, and surrounds the first and third pluralities of nanosheets. A second gate electrode extends in the second direction, intersects each of the second and fourth active patterns, and surrounds the second and fourth pluralities of nanosheets.

20 Claims, 24 Drawing Sheets

(56)                    References Cited

U.S. PATENT DOCUMENTS

| 10,847,514 | B2 | 11/2020 | Yoo et al. | |
| 10,910,376 | B2 | 2/2021 | Park et al. | |
| 2018/0233557 | A1 | 8/2018 | Cheng et al. | |
| 2020/0035705 | A1* | 1/2020 | Kim | H10D 64/017 |
| 2020/0098915 | A1* | 3/2020 | Cheng | H10D 62/116 |
| 2020/0168607 | A1* | 5/2020 | Yang | H10D 62/151 |
| 2020/0373402 | A1 | 11/2020 | Yang et al. | |
| 2021/0013200 | A1 | 1/2021 | Ha et al. | |
| 2021/0035976 | A1 | 2/2021 | Gwon et al. | |

* cited by examiner

SEMICONDUCTOR DEVICE

CROSS-REFERENCE TO RELATED APPLICATION

This application claims priority from Korean Patent Application No. 10-2021-0170080 filed on Dec. 1, 2021, in the Korean Intellectual Property Office, and all the benefits accruing therefrom under 35 U.S.C. 119, the contents of which in its entirety are herein incorporated by reference.

BACKGROUND

1. Field

Embodiments relate to a semiconductor device.

2. Description of Related Art

One of scaling schemes for increasing a density of a semiconductor device includes a multi-gate transistor, in which a silicon body in a shape of a fin or a nanowire is formed on a substrate and a gate is formed on a surface of the silicon body. Because such a multi-gate transistor uses a three-dimensional channel, it is easy to scale the same. Further, current control capability of the multi-gate transistor may be improved without increasing a gate length of the multi-gate transistor. In addition, the multi-gate transistor may effectively suppress SCE (short channel effect) in which potential of a channel region is affected by drain voltage.

SUMMARY

According to an embodiment, there is provided a semiconductor device, including a first active pattern extending in a first horizontal direction, a second active pattern extending in the first horizontal direction and spaced apart from the first active pattern in the first horizontal direction, a third active pattern extending in the first horizontal direction and spaced apart from the first active pattern in a second horizontal direction different from the first horizontal direction, a fourth active pattern extending in the first horizontal direction and spaced apart from the third active pattern in the first horizontal direction, a field insulating layer surrounding a sidewall of each of the first to fourth active patterns, a first plurality of nanosheets, a second plurality of nanosheets, a third plurality of nanosheets, and a fourth plurality of nanosheets respectively disposed the first to fourth active patterns, a first gate electrode extending in the second horizontal direction, intersecting each of the first and third active patterns, and surrounding each of the first and third plurality of nanosheets, and a second gate electrode extending in the second horizontal direction, intersecting each of the second and fourth active patterns, and surrounding each of the second and fourth plurality of nanosheets, wherein a first pitch in the first horizontal direction between the first active pattern and the second active pattern is smaller than a second pitch in the first horizontal direction between the third active pattern and the fourth active pattern, and wherein at least a part of the first gate electrode is disposed on a portion of the field insulating layer between the third active pattern and the fourth active pattern.

According to an embodiment, there is provided a semiconductor device, including a first active pattern extending in a first horizontal direction, a second active pattern extending in the first horizontal direction and spaced apart from the first active pattern in the first horizontal direction, a third active pattern extending in the first horizontal direction and spaced apart from the first active pattern in a second horizontal direction different from the first horizontal direction, a fourth active pattern extending in the first horizontal direction and spaced apart from the third active pattern in the first horizontal direction, a field insulating layer surrounding a sidewall of each of the first to fourth active patterns, a first plurality of nanosheets, a second plurality of nanosheets, a third plurality of nanosheets, and a fourth plurality of nanosheets respectively disposed the first to fourth active patterns, a first gate electrode extending in the second horizontal direction, intersecting each of the first and third active patterns, and surrounding each of the first and third plurality of nanosheets, a second gate electrode extending in the second horizontal direction, intersecting each of the second and fourth active patterns, and surrounding each of the second and fourth plurality of nanosheets, a first gate spacer disposed on each of both opposing sidewalls of the first gate electrode and extending in the second horizontal direction, and a second gate spacer disposed on each of both opposing sidewalls of the second gate electrode and extending in the second horizontal direction, wherein a first width in the first horizontal direction of the field insulating layer disposed between the first active pattern and the second active pattern is smaller than a second width in the first horizontal direction of the field insulating layer disposed between the third active pattern and the fourth active pattern, and wherein a first pitch in the first horizontal direction between the first plurality of nanosheets and the second plurality of nanosheets is smaller than a second pitch in the first horizontal direction between the third plurality of nanosheets and the fourth plurality of nanosheets.

According to an embodiment, there is provided a semiconductor device, including a substrate having an NMOS region and a PMOS region defined therein, a first active pattern extending in a first horizontal direction and disposed on the NMOS region, a second active pattern extending in the first horizontal direction and disposed on the NMOS region, wherein the second active pattern is spaced apart from the first active pattern in the first horizontal direction, a third active pattern extending in the first horizontal direction and disposed on the PMOS region, wherein third active pattern is spaced apart from the first active pattern in a second horizontal direction different from the first horizontal direction, a fourth active pattern extending in the first horizontal direction and disposed on the PMOS region, wherein the fourth active pattern is spaced apart from the third active pattern in the first horizontal direction, a field insulating layer surrounding a sidewall of each of the first to fourth active patterns, a first plurality of nanosheets, a second plurality of nanosheets, a third plurality of nanosheets, and a fourth plurality of nanosheets respectively disposed the first to fourth active patterns, a first gate electrode extending in the second horizontal direction, intersecting each of the first and third active patterns, and surrounding each of the first and third plurality of nanosheets, and a second gate electrode extending in the second horizontal direction, intersecting each of the second and fourth active patterns, and surrounding each of the second and fourth plurality of nanosheets, wherein a first pitch in the first horizontal direction between the first active pattern and the second active pattern is smaller than a second pitch in the first horizontal direction between the third active pattern and the fourth active pattern, wherein a third pitch in the first horizontal direction between the first plurality of nanosheets and the second plurality of nanosheets is smaller than a fourth pitch in the first horizontal direction between the third plurality of nanosheets and the fourth plurality of nanosheets, wherein each of the first gate electrode and the second gate electrode is not disposed on the field insulating layer between the first active pattern and the second active pattern, and wherein each of at least a part of the first gate electrode and at least a part of the second gate electrode is disposed on the field insulating layer between the third active pattern and the fourth active pattern.

BRIEF DESCRIPTION OF DRAWINGS

Features will become apparent to those of skill in the art by describing in detail example embodiments with reference to the attached drawings in which.

DETAILED DESCRIPTION

Hereinafter, semiconductor devices according to some example embodiments will be described with reference to FIG. 1 to FIG. 4.

Figure 1:
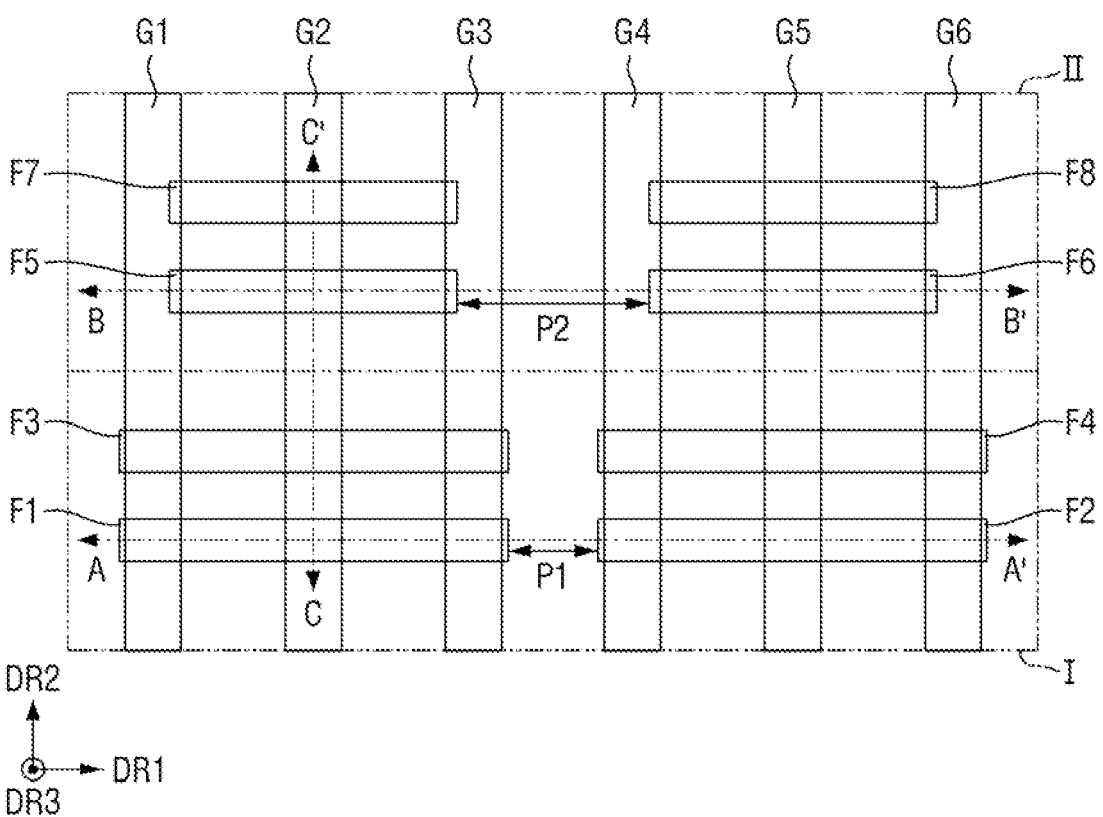
FIG. 1 is a layout diagram for illustrating a semiconductor device according to some example embodiments.
Figure 2:
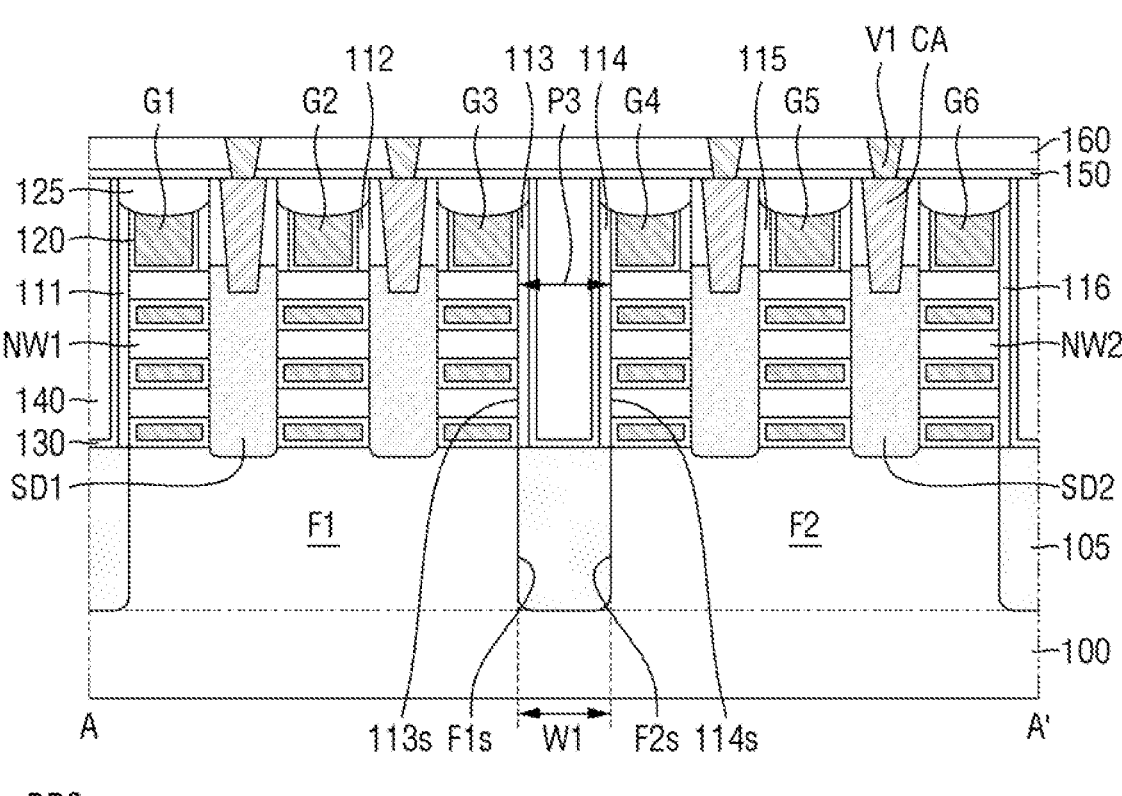
FIG. 2 is a cross-sectional view taken along a line A-A' in FIG. 1.
Figure 2:
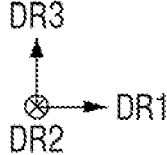
Figure 3:
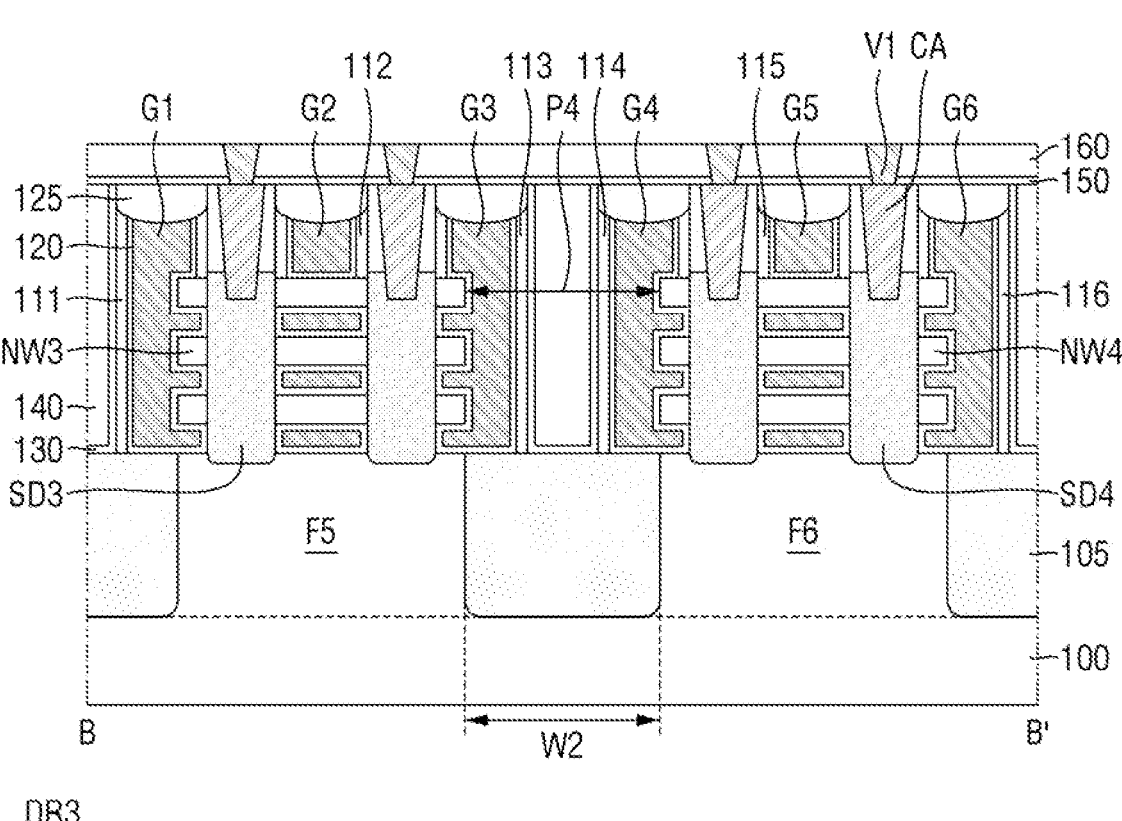
FIG. 3 is a cross-sectional view taken along a line B-B' in FIG. 1.
Figure 3:
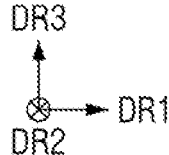
Figure 4:
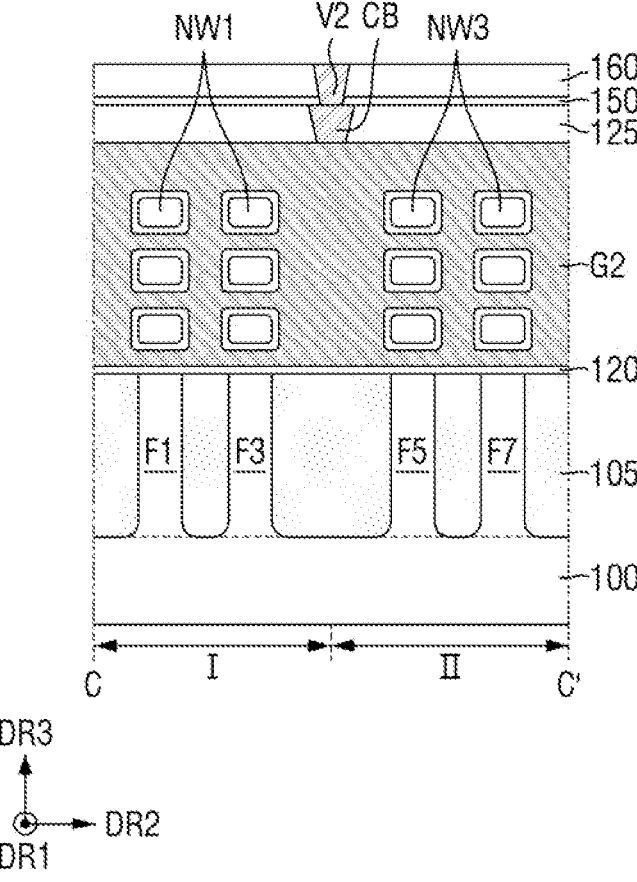
FIG. 4 is a cross-sectional view taken along a line C-C' in FIG. 1.

FIG. 1 is a layout diagram for illustrating a semiconductor device according to some example embodiments. FIG. 2 is a cross-sectional view taken along a line A-A' in FIG. 1. FIG. 3 is a cross-sectional view taken along a line B-B' in FIG. 1. FIG. 4 is a cross-sectional view taken along a line C-C' in FIG. 1.

Referring to FIG. 1 to FIG. 4, the semiconductor device according to some example embodiments include a substrate 100, a field insulating layer 105, first to eighth active patterns F1 to F8, first plurality of nanosheets to fourth plurality of nanosheets NW1 to NW4, first to sixth gate electrodes G1 to G6, first to sixth gate spacers 111 to 116, a gate insulating layer 120, a capping pattern 125, first to fourth source/drain regions SD1 to SD4, a first etch stop layer 130, a first interlayer insulating layer 140, a second etch stop layer 150, a second interlayer insulating layer 160, source/drain contact CA, a gate contact CB, a first via V1, and a second via V2.

The substrate 100 may be embodied as a silicon substrate or an SOI (silicon-on-insulator). In another implementation, the substrate 100 may include silicon germanium, SGOI (silicon germanium on insulator), indium antimonide, lead tellurium compound, indium arsenide, indium phosphide, gallium arsenide, or gallium antimonide.

An NMOS region I and a PMOS region II may defined in the substrate 100. The PMOS region II may be disposed adjacent to the NMOS region I in a second horizontal direction DR2.

Each of the first to eighth active patterns F1 to F8 may protrude from the substrate 100 in a vertical direction DR3. In this regard, the vertical direction DR3 may be defined as a direction perpendicular to both of a first horizontal direction DR1 and the second horizontal direction DR2 different from the first horizontal direction DR1. Each of the first to eighth active patterns F1 to F8 may be a portion of the substrate 100 or may include an epitaxial layer grown from the substrate 100. Each of the first to eighth active patterns F1 to F8 may extend in the first horizontal direction DR1.

Each of the first to fourth active patterns F1, F2, F3, and F4 may be disposed on the NMOS region I of the substrate 100. The second active pattern F2 may be spaced apart by a first pitch P1 from the first active pattern F1 in the first horizontal direction DR1. The third active pattern F3 may be spaced apart from the first active pattern F1 in the second horizontal direction DR2. The fourth active pattern F4 may be spaced apart from the third active pattern F3 in the first horizontal direction DR1 by the first pitch P1. The fourth active pattern F4 may be spaced apart from the second active pattern F2 in the second horizontal direction DR2.

Each of the fifth to eighth active patterns F5, F6, F7, and F8 may be disposed on the PMOS region II of the substrate 100. The fifth active pattern F5 may be spaced apart from the third active pattern F3 in the second horizontal direction DR2. The sixth active pattern F6 may be spaced apart from the fifth active pattern F5 by a second pitch P2 in the first horizontal direction DR1. The second pitch P2 may be greater than the first pitch P1. The sixth active pattern F6 may be spaced apart from the fourth active pattern F4 in the second horizontal direction DR2. The seventh active pattern F7 may be spaced apart from the fifth active pattern F5 in the second horizontal direction DR2. The eighth active pattern F8 may be spaced apart from the seventh active pattern F7 by the second pitch P2 in the first horizontal direction DR1. The eighth active pattern F8 may be spaced apart from the sixth active pattern F6 in the second horizontal direction DR2.

A pitch in the second horizontal direction DR2 between the third active pattern F3 and the fifth active pattern F5 may be greater than a pitch in the second horizontal direction DR2 between the first active pattern F1 and the third active pattern F3.

A pitch in the second horizontal direction DR2 between the third active pattern F3 and the fifth active pattern F5 may be greater than a pitch in the second horizontal direction DR2 between the fifth active pattern F5 and the seventh active pattern F7.

A pitch in the second horizontal direction DR2 between the fourth active pattern F4 and the sixth active pattern F6 may be greater than a pitch in the second horizontal direction DR2 between the second active pattern F2 and the fourth active pattern F4.

A pitch in the second horizontal direction DR2 between the fourth active pattern F4 and the sixth active pattern F6 may be greater than a pitch in the second horizontal direction DR2 between the sixth active pattern F6 and the eighth active pattern F8.

The field insulating layer 105 may be disposed on the substrate 100. The field insulating layer 105 may surround a sidewall of each of the first to eighth active patterns F1 to F8. In FIG. 2 to FIG. 4, a top face of each of the first to eighth active patterns F1 to F8 is shown to be coplanar with a top face of the field insulating layer 105, but the top face of each of the first to eighth active patterns F1 to F8 may protrude in the vertical direction DR3 beyond the top face of the field insulating layer 105.

A first width W1 in the first horizontal direction DR1 of a portion of the field insulating layer 105 disposed between the first active pattern F1 and the second active pattern F2 may be smaller than a second width W2 in the first horizontal direction of DR1 of a portion of the field insulating layer 105 disposed between the fifth active pattern F5 and the sixth active pattern F6. The field insulating layer 105 may include, for example, an oxide film, a nitride film, an oxynitride film, or a combination film thereof.

The first plurality of nanosheets to fourth plurality of nanosheets NW1 to NW4 may be respectively disposed on the first to eighth active patterns F1 to F8. For example, the first plurality of nanosheets NW1 may be disposed on each of the first active pattern F1 and the third active pattern F3. The first plurality of nanosheets NW1 may include a plurality of nanosheets stacked and spaced apart from each other in the vertical direction DR3. The first plurality of nanosheets NW1 disposed on the third active pattern F3 may be spaced apart from the first plurality of nanosheets NW1 disposed on the first active pattern F1 in the second horizontal direction DR2.

The first plurality of nanosheets NW1 may include a first sidewall and a second sidewall facing each other in the first horizontal direction DR1. Each of the first and third active patterns F1 and F3 may include a first sidewall and a second sidewall (the second sidewall is denoted as F is) facing each other in the first horizontal direction DR1. The first sidewall of the first plurality of nanosheets NW1 may be aligned, in the vertical direction DR3, with the first sidewall of each of the first and third active patterns F1 and F3. Further, the second sidewall of the first plurality of nanosheets NW1 may be aligned, in the vertical direction DR3, with the second sidewall F is of each of the first and third active patterns F1 and F3.

The second plurality of nanosheets NW2 may be disposed on each of the second active pattern F2 and the fourth active pattern F4. The second plurality of nanosheets NW2 may include a plurality of nanosheets stacked and spaced apart from each other in the vertical direction DR3. The second plurality of nanosheets NW2 disposed on the fourth active pattern F4 may be spaced apart from the second plurality of nanosheets NW2 disposed on the second active pattern F2 in the second horizontal direction DR2. The second plurality of nanosheets NW2 may be spaced apart from the first plurality of nanosheets NW1 by a third pitch P3 in the first horizontal direction DR1.

The second plurality of nanosheets NW2 may include a first sidewall and a second sidewall facing each other in the first horizontal direction DR1. Each of the second and fourth active patterns F2 and F4 may include a first sidewall (the first sidewall is denoted as F2s) and a second sidewall facing each other in the first horizontal direction DR1. The first sidewall F2s of each of the second and fourth active patterns F2 and F4 may face the second sidewall F is of each of the first and third active patterns F1 and F3. The first sidewall F2s of the second plurality of nanosheets NW2 may be aligned with the first sidewall of each of the second and fourth active patterns F2 and F4 in the vertical direction DR3. Further, the second sidewall of the second plurality of nanosheets NW2 may be aligned with the second sidewall of each of the second and fourth active patterns F2 and F4 in the vertical direction DR3.

The third plurality of nanosheets NW3 may be disposed on each of the fifth active pattern F5 and the seventh active pattern F7. The third plurality of nanosheets NW3 may include a plurality of nanosheets stacked and spaced apart from each other in the vertical direction DR3. The third plurality of nanosheets NW3 disposed on the seventh active pattern F7 may be spaced apart from the third plurality of nanosheets NW3 disposed on the fifth active pattern F5 in the second horizontal direction DR2. The third plurality of nanosheets NW3 may be spaced apart from the first plurality of nanosheets NW1 in the second horizontal direction DR2.

The third plurality of nanosheets NW3 may include a first sidewall and a second sidewall facing each other in the first horizontal direction DR1. Each of the fifth and seventh active patterns F5 and F7 may include a first sidewall and a second sidewall facing each other in the first horizontal direction DR1. The first sidewall of the third plurality of nanosheets NW3 may be aligned, in the vertical direction DR3, with the first sidewall of each of the fifth and seventh active patterns F5 and F7. Further, the second sidewall of the third plurality of nanosheets NW3 may be aligned with the second sidewall of each of the fifth and seventh active patterns F5 and F7 in the vertical direction DR3.

The fourth plurality of nanosheets NW4 may be disposed on each of the sixth active pattern F6 and the eighth active pattern F8. The fourth plurality of nanosheets NW4 may include a plurality of nanosheets stacked and spaced apart from each other in the vertical direction DR3. The fourth plurality of nanosheets NW4 disposed on the eighth active pattern F8 may be spaced apart from the fourth plurality of nanosheets NW4 disposed on the sixth active pattern F6 in the second horizontal direction DR2. The fourth plurality of nanosheets NW4 may be spaced apart from the third plurality of nanosheets NW3 by a fourth pitch P4 in the first horizontal direction DR1. The fourth pitch P4 may be greater than the third pitch P3. The fourth plurality of nanosheets NW4 may be spaced apart from the second plurality of nanosheets NW2 in the second horizontal direction DR2.

The fourth plurality of nanosheets NW4 may include a first sidewall and a second sidewall facing each other in the first horizontal direction DR1. Each of the sixth and eighth active patterns F6 and F8 may include a first sidewall and a second sidewall facing each other in the first horizontal direction DR1. The first sidewall of the fourth plurality of nanosheets NW4 may be aligned with the first sidewall of each of the sixth and eighth active patterns F6 and F8 in the vertical direction DR3. Further, the second sidewall of the fourth plurality of nanosheets NW4 may be aligned with the second sidewall of each of the sixth and eighth active patterns F6 and F8 in the vertical direction DR3.

Each nanosheet of each of the first plurality of nanosheets to fourth plurality of nanosheets NW1 to NW4 may include silicon. In FIG. 2 to FIG. 4, each of the first plurality of nanosheets to fourth plurality of nanosheets NW1 to NW4 is shown as including three nanosheets stacked and spaced apart from each other in the vertical direction DR3, but the number of the nanosheets stacked and spaced apart from each other in the vertical direction DR3 may be varied.

Each of the first to third gate electrodes G1, G2, and G3 may extend in the second horizontal direction DR2. The second gate electrode G2 may be spaced apart from the first gate electrode G1 in the first horizontal direction DR1. The third gate electrode G3 may be spaced apart from the second gate electrode G2 in the first horizontal direction DR1. Each of the first to third gate electrodes G1, G2, and G3 may intersect with the first active pattern F1, the third active pattern F3, the fifth active pattern F5, and the seventh active pattern F7. Each of the first to third gate electrodes G1, G2, and G3 may surround each of the first plurality of nanosheets NW1 and the third plurality of nanosheets NW3.

The first gate electrode G1 may not be disposed on a portion of the field insulating layer 105 disposed on the first sidewall of each of the first and third active patterns F1 and F3. At least a part of the first gate electrode G1 may be disposed on a portion of the field insulating layer 105 disposed on the first sidewall of each of the fifth and seventh active patterns F5 and F7. The first gate electrode G1 may be disposed on the first sidewall of the third plurality of nanosheets NW3. That is, the first gate electrode G1 may entirely surround an end portion of the third plurality of nanosheets NW3.

The third gate electrode G3 may not be disposed on a portion of the field insulating layer 105 disposed on the second sidewall F is of each of the first and third active patterns F1 and F3. For example, the third gate electrode G3 may not be disposed on a portion of the field insulating layer 105 between the first active pattern F1 and the second active pattern F2.

At least a part of the third gate electrode G3 may be disposed on a portion of the field insulating layer 105 disposed on the second sidewall of each of the fifth and seventh active patterns F5 and F7. For example, at least a part of the third gate electrode G3 may be disposed on a portion of the field insulating layer 105 between the fifth active pattern F5 and the sixth active pattern F6. The third gate electrode G3 may be disposed on the second sidewall of the third plurality of nanosheets NW3. That is, the third gate electrode G3 may entirely surround the end portion of the third plurality of nanosheets NW3.

Each of the fourth to sixth gate electrodes G4, G5, and G6 may extend in the second horizontal direction DR2. The fifth gate electrode G5 may be spaced apart from the fourth gate electrode G4 in the first horizontal direction DR1. The sixth gate electrode G6 may be spaced apart from the fifth gate electrode G5 in the first horizontal direction DR1. Each of the fourth to sixth gate electrodes G4, G5, and G6 may intersect the second active pattern F2, the fourth active pattern F4, the sixth active pattern F6, and the eighth active pattern F8. Each of the fourth to sixth gate electrodes G4, G5, and G6 may surround each of the second plurality of nanosheets NW2 and the fourth plurality of nanosheets NW4.

The fourth gate electrode G4 may not be disposed on a portion of the field insulating layer 105 disposed on the first sidewall F2s of each of the second and fourth active patterns F2 and F4. For example, the fourth gate electrode G4 may not be disposed on a portion of the field insulating layer 105 between the first active pattern F1 and the second active pattern F2.

At least a part of the fourth gate electrode G4 may be disposed on a portion of the field insulating layer 105 disposed on the first sidewall of each of the sixth and eighth active patterns F6 and F8. For example, at least a part of the fourth gate electrode G4 may be disposed on a portion of the field insulating layer 105 between the fifth active pattern F5 and the sixth active pattern F6. The fourth gate electrode G4 may be disposed on the first sidewall of the fourth plurality of nanosheets NW4. That is, the fourth gate electrode G4 may entirely surround an end portion of the fourth plurality of nanosheets NW4.

The sixth gate electrode G6 may not be disposed on a portion of the field insulating layer 105 disposed on the second sidewall of each of the second and fourth active patterns F2 and F4. At least a part of the sixth gate electrode G6 may be disposed on a portion of the field insulating layer 105 disposed on the second sidewall of each of the sixth and eighth active patterns F6 and F8. The sixth gate electrode G6 may be disposed on the second sidewall of the fourth plurality of nanosheets NW4. That is, the sixth gate electrode G6 may entirely surround the end portion of the fourth plurality of nanosheets NW4.

Each of the first to sixth gate electrodes G1 to G6 may include at least one of, for example, titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), combinations thereof, or oxidized products thereof in a conductive metal oxide or oxynitride.

The first source/drain region SD1 may be disposed on the first active pattern F1, and between the first gate electrode G1 and the second gate electrode G2 and between the second gate electrode G2 and the third gate electrode G3, respectively. Further, the first source/drain region SD1 may be disposed on the third active pattern F3, and between the first gate electrode G1 and the second gate electrode G2 and between the second gate electrode G2 and the third gate electrode G3, respectively. The first source/drain region SD1 may be in contact with the first plurality of nanosheets NW1.

The second source/drain region SD2 may be disposed on the second active pattern F2, and between the fourth gate electrode G4 and the fifth gate electrode G5 and between the fifth gate electrode G5 and the sixth gate electrode G6, respectively. Further, the second source/drain region SD2 may be disposed on the fourth active pattern F4, and between the fourth gate electrode G4 and the fifth gate electrode G5 and between the fifth gate electrode G5 and the sixth gate electrode G6, respectively. The second source/drain region SD2 may be in contact with the second plurality of nanosheets NW2.

The third source/drain region SD3 may be disposed on the fifth active pattern F5, and between the first gate electrode G1 and the second gate electrode G2 and between the second gate electrode G2 and the third gate electrode G3, respectively. Further, the third source/drain region SD3 may be disposed on the seventh active pattern F7, and between the first gate electrode G1 and the second gate electrode G2 and between the second gate electrode G2 and the third gate electrode G3, respectively. The third source/drain region SD3 may be in contact with the third plurality of nanosheets NW3.

The fourth source/drain region SD4 may be disposed on the sixth active pattern F6, and between the fourth gate electrode G4 and the fifth gate electrode G5 and between the fifth gate electrode G5 and the sixth gate electrode G6, respectively. Further, the fourth source/drain region SD4 may be disposed on the eighth active pattern F8, and between the fourth gate electrode G4 and the fifth gate electrode G5 and between the fifth gate electrode G5 and the sixth gate electrode G6, respectively. The fourth source/drain region SD4 may be in contact with the fourth plurality of nanosheets NW4.

The first gate spacer 111 may extend in the second horizontal direction DR2 and may be disposed on each of both sidewalls of the first gate electrode G1. The first gate spacer 111 disposed on the first sidewall of the first gate electrode G1 may be disposed on the field insulating layer 105. The first gate spacer 111 disposed on the second sidewall of the first gate electrode G1 may be disposed on each of the field insulating layer 105, the first plurality of nanosheets NW1, and the third plurality of nanosheets NW3.

For example, the first gate spacer 111 disposed on the first sidewall of the first gate electrode G1 may contact the first sidewall of the first plurality of nanosheets NW1. For example, a sidewall of the first gate spacer 111 in contact with the first sidewall of the first plurality of nanosheets NW1 may be aligned with the first sidewall of each of the first and third active patterns F1 and F3 in the vertical direction DR3. For example, the first gate spacer 111 disposed on the first sidewall of the first gate electrode G1 may be spaced apart from the first sidewall of the third plurality of nanosheets NW3 in the first horizontal direction DR1.

The second gate spacer 112 may extend in the second horizontal direction DR2 and may be disposed on each of both sidewalls of the second gate electrode G2. The second gate spacer 112 may be disposed on each of the field insulating layer 105, the first plurality of nanosheets NW1, and the third plurality of nanosheets NW3.

The third gate spacer 113 may extend in the second horizontal direction DR2 and may be disposed on each of both sidewalls of the third gate electrode G3. The third gate spacer 113 disposed on the first sidewall of the third gate electrode G3 may be disposed on each of the field insulating layer 105, the first plurality of nanosheets NW1, and the third plurality of nanosheets NW3. The third gate spacer 113 disposed on the second sidewall of the third gate electrode G3 may be disposed on the field insulating layer 105.

For example, the third gate spacer 113 disposed on the second sidewall of the third gate electrode G3 may contact the second sidewall of the first plurality of nanosheets NW1. For example, a sidewall 113s of the third gate spacer 113 in contact with the second sidewall of the first plurality of nanosheets NW1 may be aligned with the second sidewall F is of each of the first and third active patterns F1 and F3 in the vertical direction DR3. For example, the third gate spacer 113 disposed on the second sidewall of the third gate electrode G3 may be spaced apart from the second sidewall of the third plurality of nanosheets NW3 in the first horizontal direction DR1.

The fourth gate spacer 114 may extend in the second horizontal direction DR2 and may be disposed on each of both sidewalls of the fourth gate electrode G4. The fourth gate spacer 114 disposed on the first sidewall of the fourth gate electrode G4 may be disposed on the field insulating layer 105. The fourth gate spacer 114 disposed on the second sidewall of the fourth gate electrode G4 may be disposed on each of the field insulating layer 105, the second plurality of nanosheets NW2, and the fourth plurality of nanosheets NW4.

For example, the fourth gate spacer 114 disposed on the first sidewall of the fourth gate electrode G4 may contact the first sidewall of the second plurality of nanosheets NW2. For example, a sidewall 114s of the fourth gate spacer 114 in contact with the first sidewall of the second plurality of nanosheets NW2 may be aligned with the first sidewall F2s of each of the second and fourth active patterns F2 and F4 in the vertical direction DR3. For example, the fourth gate spacer 114 disposed on the first sidewall of the fourth gate electrode G4 may be spaced apart from the first sidewall of the fourth plurality of nanosheets NW4 in the first horizontal direction DR1.

The fifth gate spacer 115 may extend in the second horizontal direction DR2 and may be disposed on each of both sidewalls of the fifth gate electrode G5. The fifth gate spacer 115 may be disposed on each of the field insulating layer 105, the second plurality of nanosheets NW2 and the fourth plurality of nanosheets NW4. The sixth gate spacer 116 may extend in the second horizontal direction DR2 and may be disposed on each of both sidewalls of the sixth gate electrode G6. The sixth gate spacer 116 disposed on the first sidewall of the sixth gate electrode G6 may be disposed on each of the field insulating layer 105, the second plurality of nanosheets NW2, and the fourth plurality of nanosheets NW4. The sixth gate spacer 116 disposed on the second sidewall of the sixth gate electrode G6 may be disposed on the field insulating layer 105.

For example, the sixth gate spacer 116 disposed on the second sidewall of the sixth gate electrode G6 may contact the second sidewall of the second plurality of nanosheets NW2. For example, the sidewall of the sixth gate spacer 116 in contact with the second sidewall of the second plurality of nanosheets NW2 may be aligned with the second sidewall of each of the second and fourth active patterns F2 and F4 in the vertical direction DR3. For example, the sixth gate spacer 116 disposed on the second sidewall of the sixth gate electrode G6 may be spaced apart from the second sidewall of the fourth plurality of nanosheets NW4 in the first horizontal direction DR1.

Each of the first to sixth gate spacers 111 to 116 may include, for example, at least one of silicon nitride (SiN), silicon oxynitride (SiON), silicon carbonitride (SiCN), silicon oxycarbonitride (SiOCN), silicon boron nitride (SiBN), silicon oxyboron nitride (SiOBN), silicon oxycarbide (SiOC), combinations thereof, etc.

The gate insulating layer 120 may be disposed between the first gate electrode G1 and the first gate spacer 111, between the second gate electrode G2 and the second gate spacer 112, between the third gate electrode G3 and the third gate spacer 113, between the fourth gate electrode G4 and the fourth gate spacer 114, between the fifth gate electrode G5 and the fifth gate spacer 115, and between the sixth gate electrode G6 and the sixth gate spacer 116, respectively. The gate insulating layer 120 may be disposed between each of the first to third gate electrodes G1, G2, and G3 and each of the first and third source/drain regions SD1 and SD3. The gate insulating layer 120 may be disposed between each of the fourth to sixth gate electrodes G4, G5, and G6 and each of the second and fourth source/drain regions SD2 and SD4.

Further, the gate insulating layer 120 may be disposed between each of the first to third gate electrodes G1, G2, and G3 and each of the first, third, fifth and seventh active patterns F1, F3, F5, and F7. The gate insulating layer 120 may be disposed between each of the fourth to sixth gate electrodes G4, G5, and G6 and each of the second, fourth, sixth and eighth active patterns F2, F4, F6, and F8. The gate insulating layer 120 may be disposed between each of the first to third gate electrodes G1, G2, and G3 and each of the first plurality of nanosheets NW1 and the third plurality of nanosheets NW3. The gate insulating layer 120 may be disposed between each of the fourth to sixth gate electrodes G4, G5, and G6 and each of the second plurality of nanosheets NW2 and the fourth plurality of nanosheets NW4.

The gate insulating layer 120 may include at least one of silicon oxide, silicon oxynitride, silicon nitride, or a high dielectric constant material (high-k material) having a higher dielectric constant than that of silicon oxide. The high dielectric constant material may include at least one of, for example, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

The semiconductor device according to some further example embodiments may include an NC (negative capacitance) FET using a negative capacitor. For example, the gate insulating layer 120 may include a ferroelectric material film having ferroelectric properties and a paraelectric material film having paraelectric properties.

The ferroelectric material film may have negative capacitance, and the paraelectric material film may have positive capacitance. For example, when two or more capacitors may be connected in series to each other, and capacitance of each of the capacitors has a positive value, a total capacitance is smaller than capacitance of each individual capacitor. On the contrary, when at least one of capacitances of two or more capacitors connected in series to each other has a negative value, a total capacitance may have a positive value and be greater than an absolute value of each individual capacitance.

When the ferroelectric material film with negative capacitance and the paraelectric material film with positive capacitance are connected in series to each other, a total capacitance value of the ferroelectric material film and the paraelectric material film connected in series to each other may be increased. Using the increase in the total capacitance value, a transistor including the ferroelectric material film may have a subthreshold swing (SS) lower than about 60 mV/decade at room temperature.

The ferroelectric material film may have ferroelectric properties. The ferroelectric material film may include, for example, at least one of hafnium oxide, hafnium zirconium oxide, barium strontium titanium oxide, barium titanium oxide, and lead zirconium titanium oxide. In this connection, in one example, hafnium zirconium oxide may refer to a material obtain by doping hafnium oxide with zirconium (Zr). In another example, hafnium zirconium oxide may refer to a compound of hafnium (Hf), zirconium (Zr), and oxygen (O).

The ferroelectric material film may further contain doped dopants. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr) and tin (Sn). A type of the dopant contained in the ferro-electric material film may vary depending on a type of the ferroelectric material included in the ferroelectric material film.

When the ferroelectric material film includes hafnium oxide, the dopant contained in the ferroelectric material film may include, for example, at least one of gadolinium (Gd), silicon (Si), zirconium (Zr), aluminum (Al), and yttrium (Y).

When the dopant is aluminum (Al), the ferroelectric material film may contain about 3 to about 8 at % (atomic %) of aluminum. In this connection, a content of the dopant may be a content of aluminum based on a sum of hafnium and aluminum.

When the dopant is silicon (Si), the ferroelectric material film may contain about 2 to about 10 at % of silicon. When the dopant is yttrium (Y), the ferroelectric material film may contain about 2 to about 10 at % yttrium. When the dopant is gadolinium (Gd), the ferroelectric material film may contain about 1 to about 7 at % gadolinium. When the dopant is zirconium (Zr), the ferroelectric material film may contain about 50 to about 80 at % zirconium.

The paraelectric material film may have paraelectric properties. The paraelectric material film may include, for example, at least one of silicon oxide and metal oxide having a high dielectric constant. The metal oxide contained in the paraelectric material film may include, for example, at least one of hafnium oxide, zirconium oxide and aluminum oxide.

The ferroelectric material film and the paraelectric material film may include the same material. The ferroelectric material film may have ferroelectric properties, but the paraelectric material film may not have the ferroelectric properties. For example, when each of the ferroelectric material film and the paraelectric material film includes hafnium oxide, a crystal structure of hafnium oxide contained in the ferroelectric material film is different from a crystal structure of hafnium oxide contained in the paraelectric material film.

The ferroelectric material film may have a thickness sized to exhibit ferroelectric properties. Although the thickness of the ferroelectric material film may be, for example, in a range of about 0.5 nm to about 10 nm, but a critical thickness exhibiting the ferroelectric properties may be vary based on a type of the ferroelectric material, and thus the thickness of the ferroelectric material film may vary depending on the type of the ferroelectric material.

In one example, the gate insulating layer 120 may include one ferroelectric material film. In another example, the gate insulating layer 120 may include a plurality of ferroelectric material films spaced apart from each other. The gate insulating layer 120 may have a stack structure in which a plurality of ferroelectric material films and a plurality of paraelectric material films are alternately stacked with each other.

The capping pattern 125 may extend in the second horizontal direction DR2 and may be disposed on each of the first to sixth gate electrodes G1 to G6. For example, the capping pattern 125 may be disposed on a top face of each of the first to sixth gate spacers 111 to 116. In some further example embodiments, the capping pattern 125 may be disposed between adjacent ones of the first to sixth gate spacers 111 to 116. The capping pattern 125 may include, for example, at least one of silicon nitride (SiN), silicon oxynitride (SiON), silicon oxide (SiO$_2$), silicon carbonitride (SiCN), silicon oxycarbonitride (SiOCN), and combinations thereof.

The first etch stop layer 130 may be disposed on a top face of the field insulating layer 105. The first etch stop layer 130 may extend in the vertical direction DR3 along a sidewall of each of the first to sixth gate spacers 111 to 116 and the capping pattern 125 while being disposed on the field insulating layer 105. For example, a top face of the first etch stop layer 130 may be coplanar with a top face of the capping pattern 125. The first etch stop layer 130 may include, for example, at least one of silicon oxide, silicon nitride, silicon oxynitride, and a low dielectric constant material.

The first interlayer insulating layer 140 may be disposed on the first etch stop layer 130. The first interlayer insulating layer 140 may be disposed on each of the first to fourth source/drain regions SD1 to SD4. For example, a top face of the first interlayer insulating layer 140 may be coplanar with a top face of the capping pattern 125.

The first interlayer insulating layer 140 may include, for example, at least one of silicon oxide, silicon nitride, silicon oxynitride, and a low dielectric constant (low-k) material. The low dielectric constant material may include, for example, fluorinated tetraethylorthosilicate (FTEOS), hydrogen silsesquioxane (HSQ), bis-benzocyclobutene (BCB), tetramethylorthosilicate (TMOS), octamethylcyclotetrasiloxane (OMCTS), hexamethyldisiloxane (HMDS), trimethylsilyl borate (TMSB), diacetoxyditertiarybutosiloxane (DADBS), trimethylsilyl phosphate (TMSP), polytetrafluoroethylene (PTFE), TOSZ (Tonen SilaZen), FSG (fluoride silicate glass), polyimide nanofoams such as polypropylene oxide, CDO (carbon doped silicon oxide), OSG (organo silicate glass), SiLK, amorphous fluorinated carbon, silica aerogels, silica xerogels, mesoporous silica, a combination thereof, etc.

The source/drain contact CA may extend through the first interlayer insulating layer 140 in the vertical direction DR3, and may be connected to any one of the first to fourth source/drain regions SD1 to SD4. For example, a top face of the source/drain contact CA may be coplanar with a top face of the first interlayer insulating layer 140. FIG. 2 and FIG. 3 show that the source/drain contact CA is formed as a single film, but the source/drain contact CA may be formed as a multilayer. The source/drain contact CA may include a conductive material.

Although not shown in FIGS. 2 and 3, a silicide layer may be disposed between each of the first to fourth source/drain regions SD1 to SD4 and the source/drain contact CA. The silicide layer may include, for example, a metal silicide material.

The gate contact CB may extend through the capping pattern 125 in the vertical direction DR3, and may be connected to any one of the first to sixth gate electrodes G1 to G6. A top face of the gate contact CB may be coplanar with a top face of the first interlayer insulating layer 140. Although it is shown in FIG. 4 that the gate contact CB is formed as a single film, the gate contact CB may be formed as a multilayer. The gate contact CB may include a conductive material.

The second etch stop layer 150 may be disposed on the first interlayer insulating layer 140 and the capping pattern 125. The second etch stop layer 150 may cover a portion of a top face of the source/drain contact CA and a portion of a top face of the gate contact CB. Although FIG. 2 to FIG. 4 shows that the second etch stop layer 150 is formed as a single film, the second etch stop layer 150 may be formed as multiple films. The second etch stop layer 150 may include, for example, at least one of silicon oxide, silicon nitride, silicon oxynitride, and a low dielectric constant material.

The second interlayer insulating layer 160 may be disposed on the second etch stop layer 150. The second interlayer insulating layer 160 may include, for example, at least one of silicon oxide, silicon nitride, silicon oxynitride, and a low dielectric constant material.

The first via V1 may extend through the second interlayer insulating layer 160 and the second etch stop layer 150 in the vertical direction DR3, and may be connected to the source/drain contact CA. FIG. 2 and FIG. 4 show that the first via V1 is formed as a single film, but the first via V1 may be formed as a multilayer. The first via V1 may contain a conductive material.

The second via V2 may extend through the second interlayer insulating layer 160 and the second etch stop layer 150 in the vertical direction DR3, and may be connected to the gate contact CB. Although FIG. 4 shows that the second via V2 is formed as a single film, the second via V2 may be formed as a multilayer. The second via V2 may include a conductive material.

As described above, in a semiconductor device according to some example embodiments, the first pitch P1 in the first horizontal direction DR1 between the active patterns in the NMOS region I may be smaller than the second pitch P2 in the first horizontal direction DR1 between the active patterns in the PMOS region II. At least a part of the gate electrode in the PMOS region II may cover the sidewall in the first horizontal direction DR1 of the plurality of nanosheets. Thus, reliability of the semiconductor device may be improved.

Hereinafter, a method for manufacturing a semiconductor device according to some example embodiments will be described with reference to FIG. 1 to FIG. 17.

FIG. 5 to FIG. 17 are diagrams of intermediate step structures for illustrating a method for manufacturing a semiconductor device according to some example embodiments.

Figure 5:
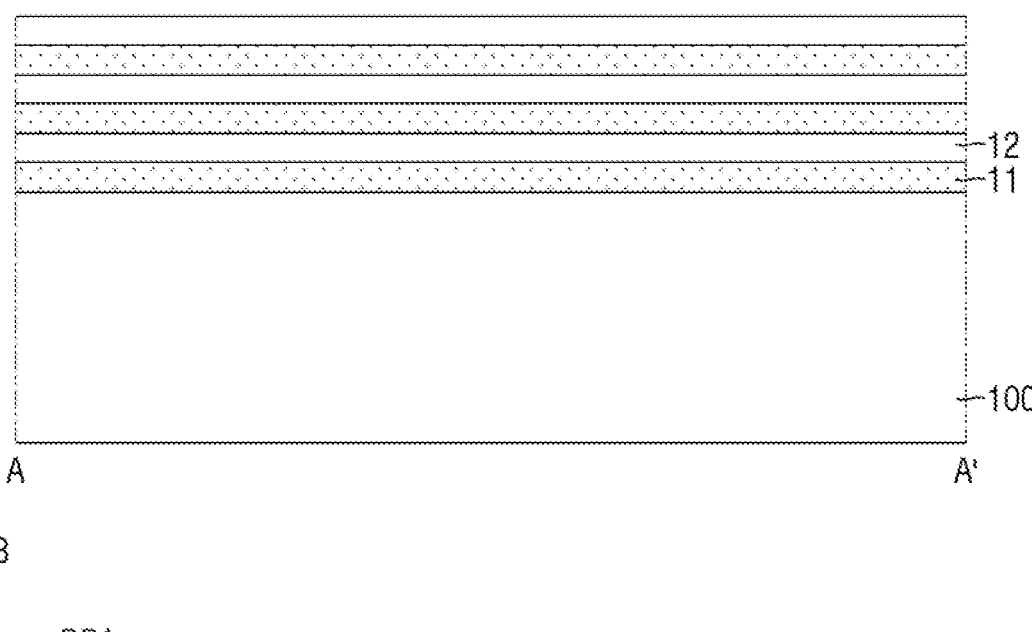
FIG. 5 to FIG. 17 are diagrams of intermediate step structures for illustrating a method for manufacturing a semiconductor device according to some example embodiments.

Referring to FIG. 5, a first semiconductor layer 11 and a second semiconductor layer 12 may be alternately stacked on the substrate 100. For example, a stack of six layers in which three first semiconductor layers 11 and three second semiconductor layers 12 are alternately stacked with each other may be formed on the substrate 100. The first semiconductor layer 11 may include, for example, silicon germanium (SiGe). The second semiconductor layer 12 may include, for example, silicon (Si).

Figure 6:
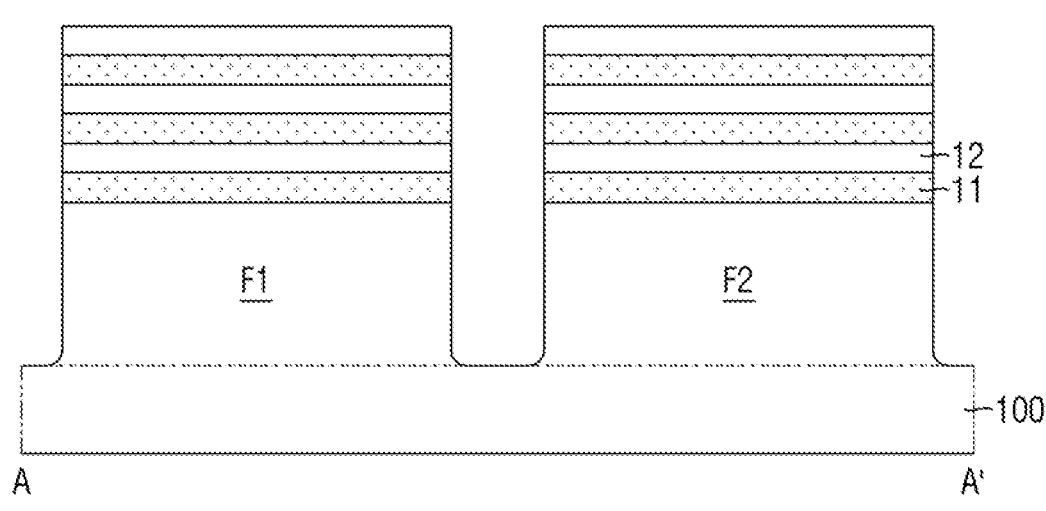
Figure 6:
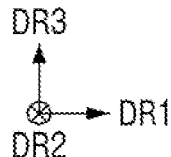
Figure 7:
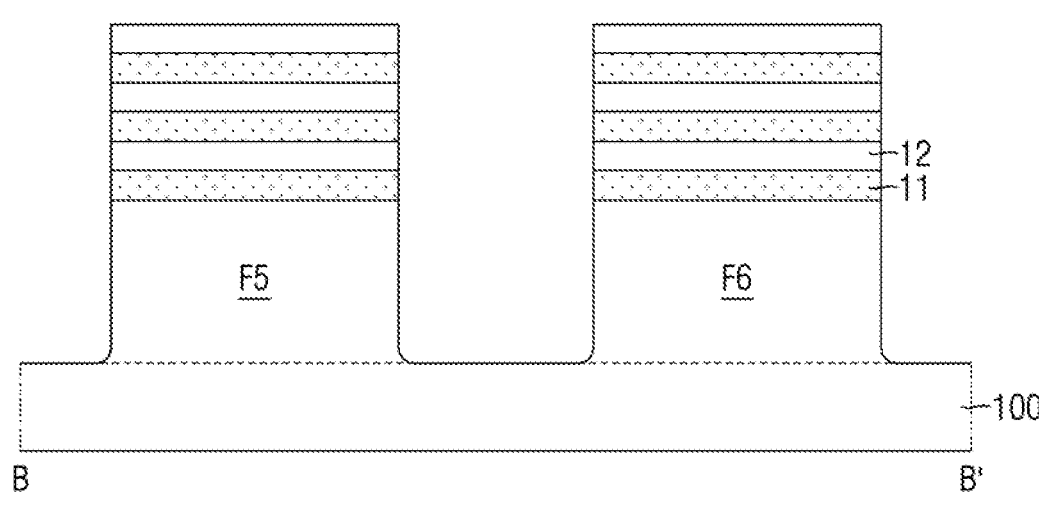
Figure 7:
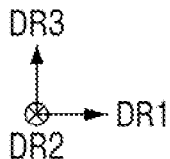

Referring to FIG. 6 and FIG. 7, a portion of each of the first semiconductors layer 11, the second semiconductor layers 12 and the substrate 100 may be etched. In the etching process, for example, the first and the second active patterns F1 and F2 are formed on the NMOS region (I of FIG. 1) of the substrate 100, and the fifth and sixth active patterns F5 and F6 may be formed on the PMOS region (II of FIG. 1) of the substrate 100. A pitch in the first horizontal direction DR1 between the first active pattern F1 and the second active pattern F2 may be smaller than a pitch in the first horizontal direction DR1 between the fifth active pattern F5 and the sixth active pattern F6.

Figure 8:
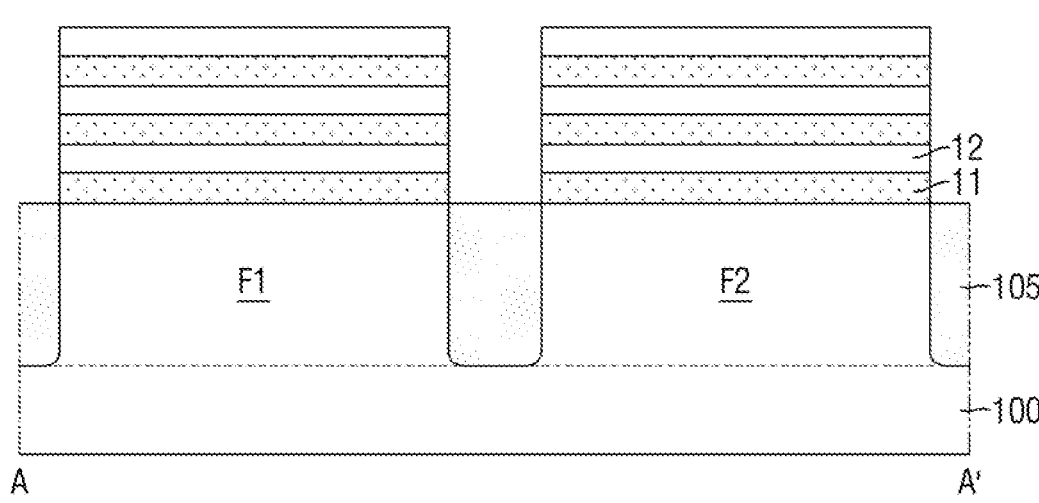
Figure 8:
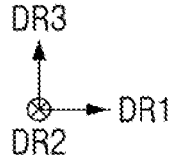
Figure 9:
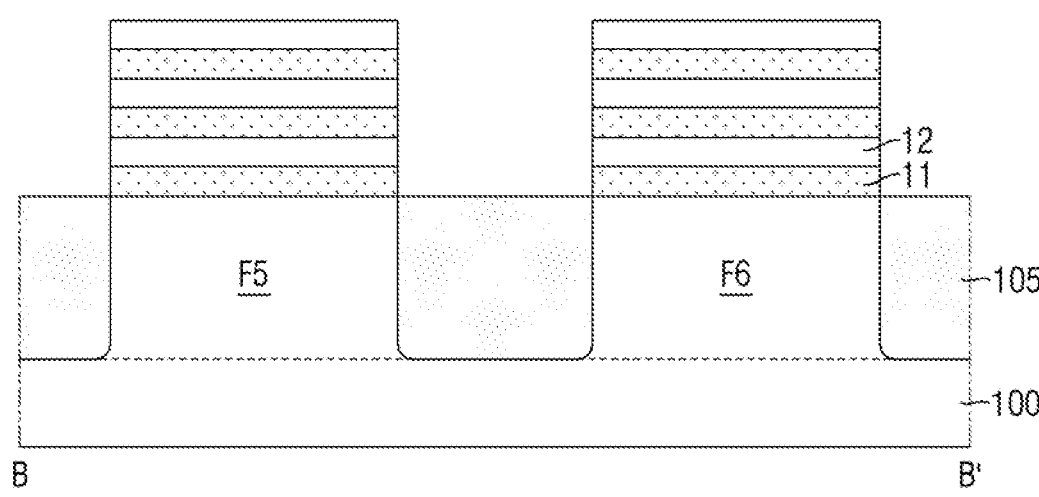
Figure 9:
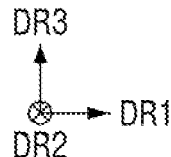

Referring to FIG. 8 and FIG. 9, the field insulating layer 105 may be formed on the substrate 100. For example, the field insulating layer 105 may surround the sidewall of each of the first active pattern F1, the second active pattern F2, the fifth active pattern F5 and the sixth active pattern F6. For example, a top face of the field insulating layer 105 may be coplanar with a top face of each of the first active pattern F1, the second active pattern F2, the fifth active pattern F5 and the sixth active pattern F6.

Figure 10:
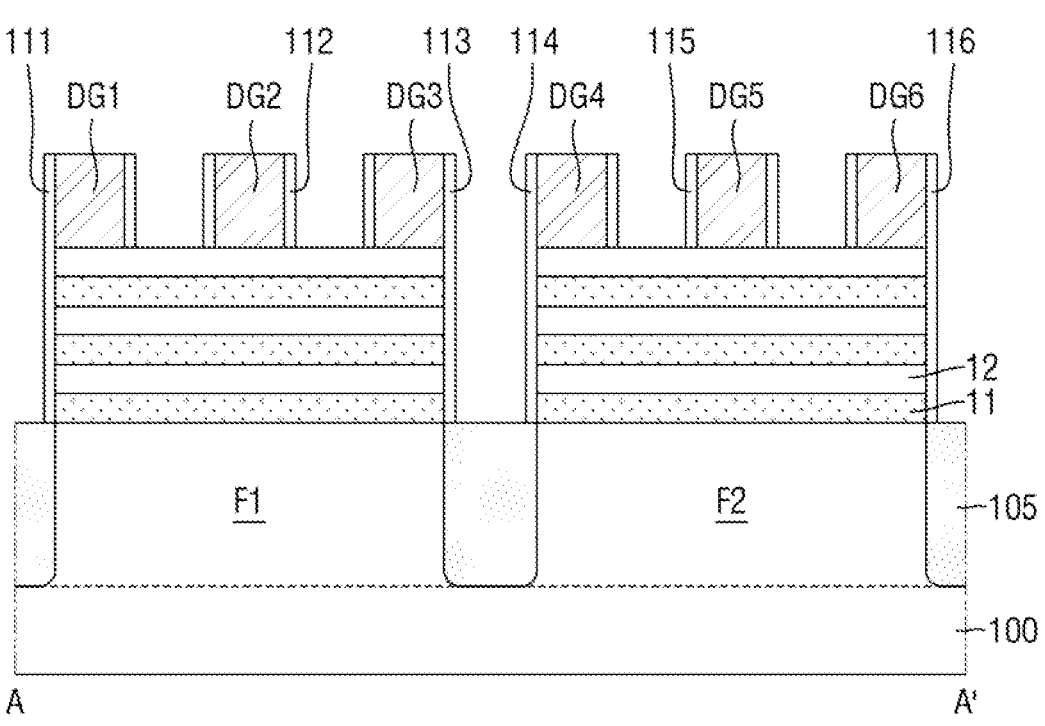
Figure 10:
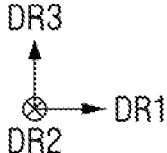
Figure 11:
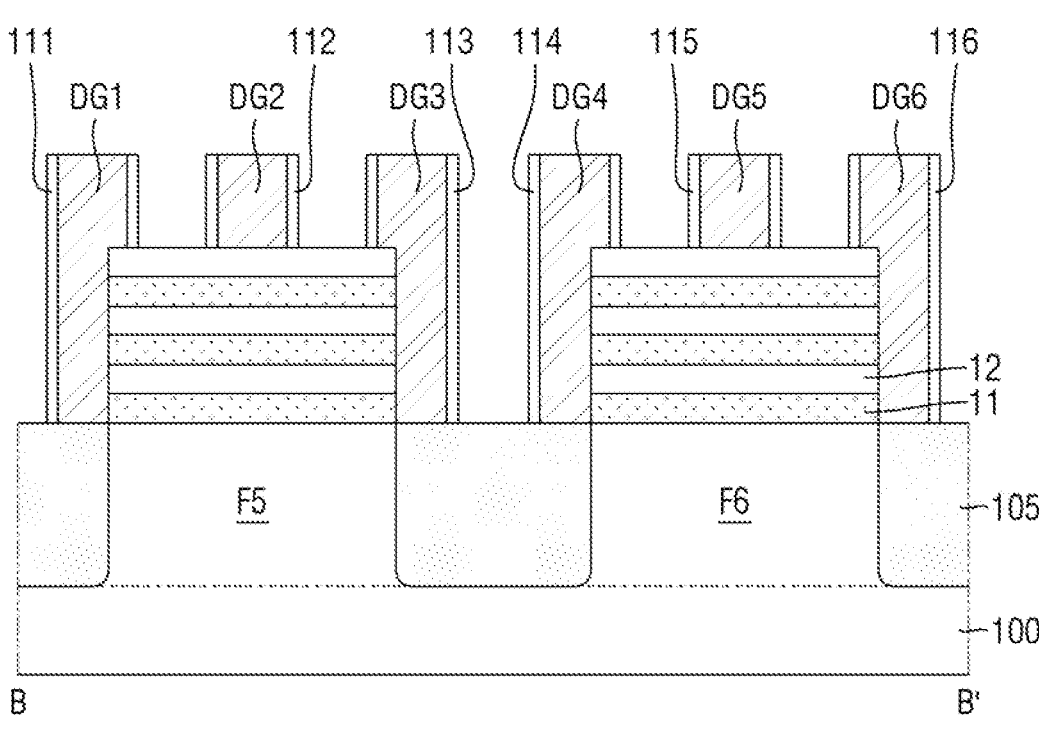
Figure 11:
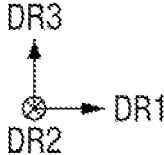

Referring to FIG. 10 and FIG. 11, first to sixth dummy gates DG1 to DG6 may be formed on the field insulating layer 105 and the stack in which the first and second semiconductor layers 11 and 12 are alternately stacked with each other. Each of the first to sixth dummy gates DG1 to DG6 may extend in the second horizontal direction DR2. Each of the first to sixth dummy gates DG1 to DG6 may be sequentially spaced apart from each other in the first horizontal direction DR1.

For example, each of the first to third dummy gates DG1, DG2, and DG3 may intersect with the first active pattern F1 and the fifth active pattern F5. One sidewall of the first dummy gate DG1 may be aligned with the first sidewall of the second semiconductor layer 12 formed on the first active pattern F1 in the vertical direction DR3. At least a part of the first dummy gate DG1 may be formed on a portion of the field insulating layer 105 and on the first sidewall of the second semiconductor layer 12 formed on the fifth active pattern F5.

One sidewall of the third dummy gate DG3 may be aligned with the second sidewall of the second semiconductor layer 12 formed on the first active pattern F1 in the vertical direction DR3. In this connection, the second sidewall of the second semiconductor layer 12 may be defined as a sidewall thereof facing the first sidewall of the second semiconductor layer 12 in the first horizontal direction DR1. At least a part of the third dummy gate DG3 may be formed on a portion of the field insulating layer 105 and on the second sidewall of the second semiconductor layer 12 formed on the fifth active pattern F5.

One sidewall of the fourth dummy gate DG4 may be aligned with the first sidewall of the second semiconductor layer 12 formed on the second active pattern F2 in the vertical direction DR3. At least a part of the fourth dummy gate DG4 may be formed on a portion of the field insulating layer 105 and on the first sidewall of the second semiconductor layer 12 formed on the sixth active pattern F6. One sidewall of the sixth dummy gate DG6 may be aligned with the second sidewall of the second semiconductor layer 12 formed on the first active pattern F1 in the vertical direction DR3. At least a part of the sixth dummy gate DG6 may be formed on a portion of the field insulating layer 105 and on the second sidewall of the second semiconductor layer 12 formed on the sixth active pattern F6.

Subsequently, each of the first to sixth gate spacers 111 to 116 may be formed on both opposing sidewalls of each of the first to sixth dummy gates DG1 to DG6. Each of the first to sixth gate spacers 111 to 116 may extend in the second horizontal direction DR2.

Figure 12:
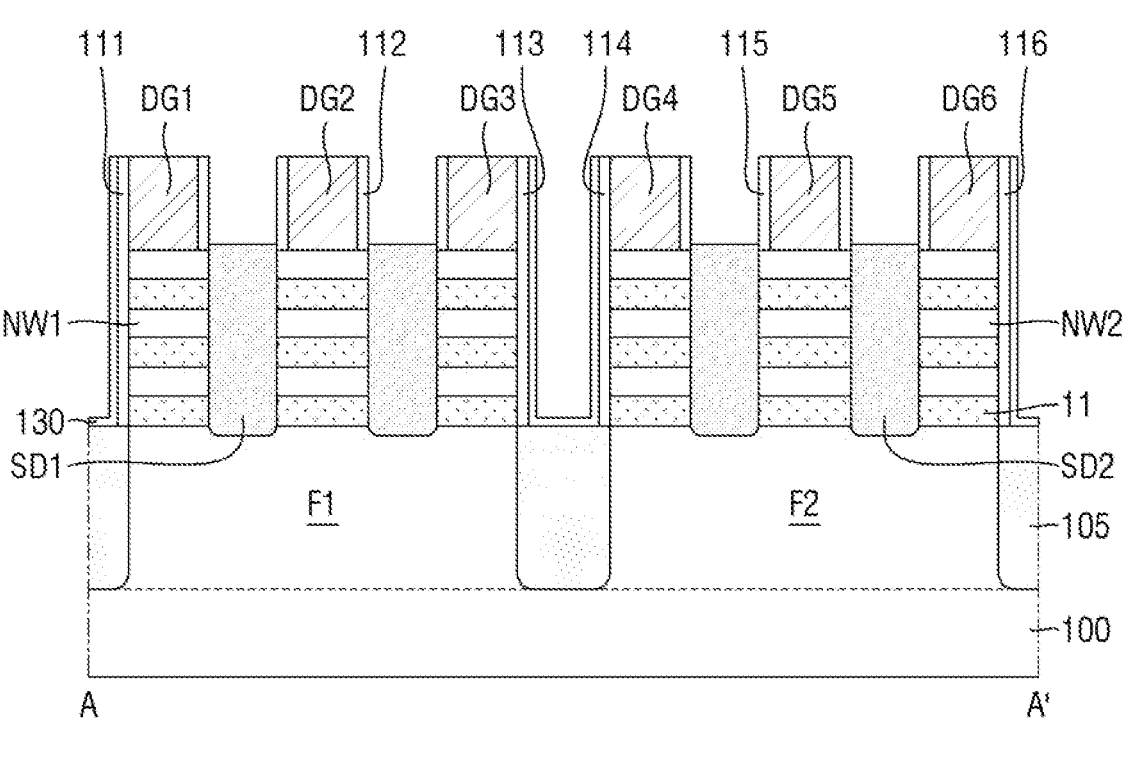
Figure 12:
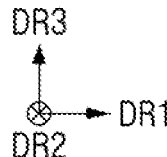
Figure 13:
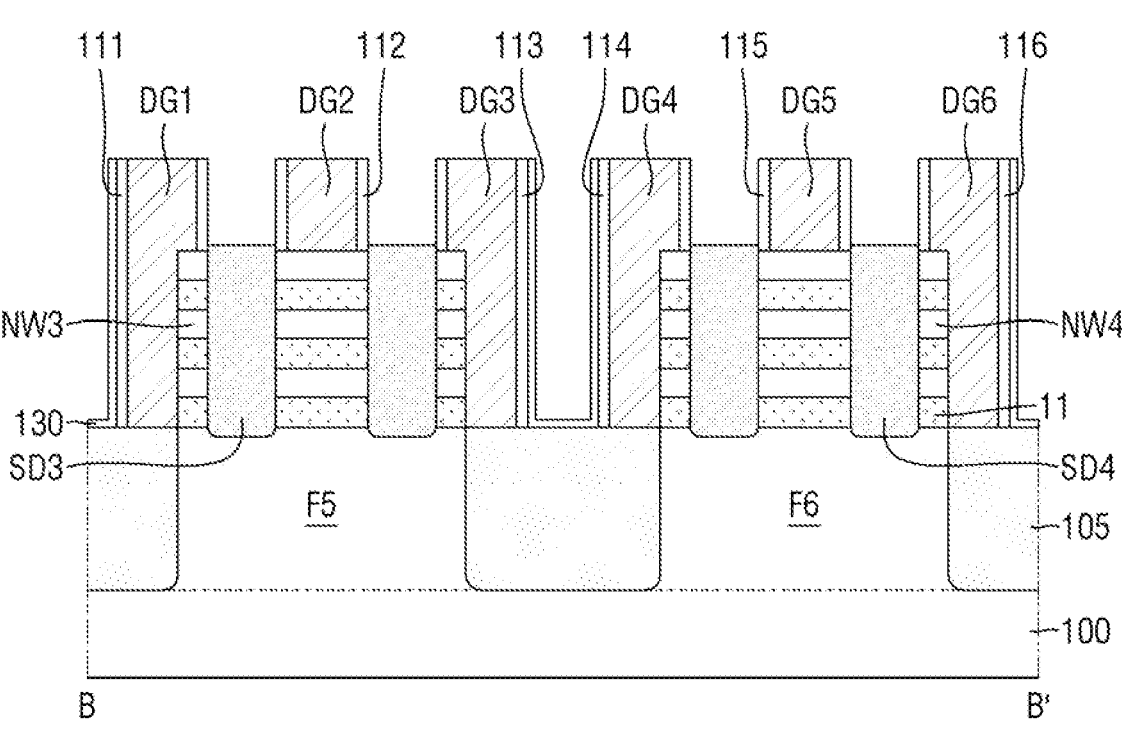
Figure 13:
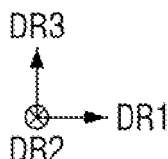

Referring to FIG. 12 and FIG. 13, the first etch stop layer 130 may be formed on the top face of the field insulating layer 105. Further, the first etch stop layer 130 may be formed along the sidewall of each of the first to sixth gate spacers 111 to 116 and the capping pattern 125 and may be disposed on the field insulating layer 105.

Subsequently, each of the first and third source/drain regions SD1 and SD3 may be formed between adjacent ones of the first to third dummy gates DG1, DG2, and DG3. For example, while being disposed on the first active pattern F1, the first source/drain region SD1 may be formed between adjacent ones of the first to third dummy gates DG1, DG2, and DG3. While being disposed on the fifth active pattern F5, the third source/drain region SD3 may be formed between adjacent ones of the first to third dummy gates DG1, DG2, and DG3.

Further, each of the second and fourth source/drain regions SD2 and SD4 may be formed between adjacent ones of the fourth dummy gates DG4, DG5, and DG6. For example, the second source/drain region SD2 may be formed between adjacent ones of the fourth to sixth dummy gates DG4, DG5, and DG6 while being disposed on the second active pattern F2. While being disposed on the sixth active pattern F6, the fourth source/drain region SD4 may be formed between adjacent ones of the fourth to sixth dummy gates DG4, DG5, and DG6.

Figure 14:
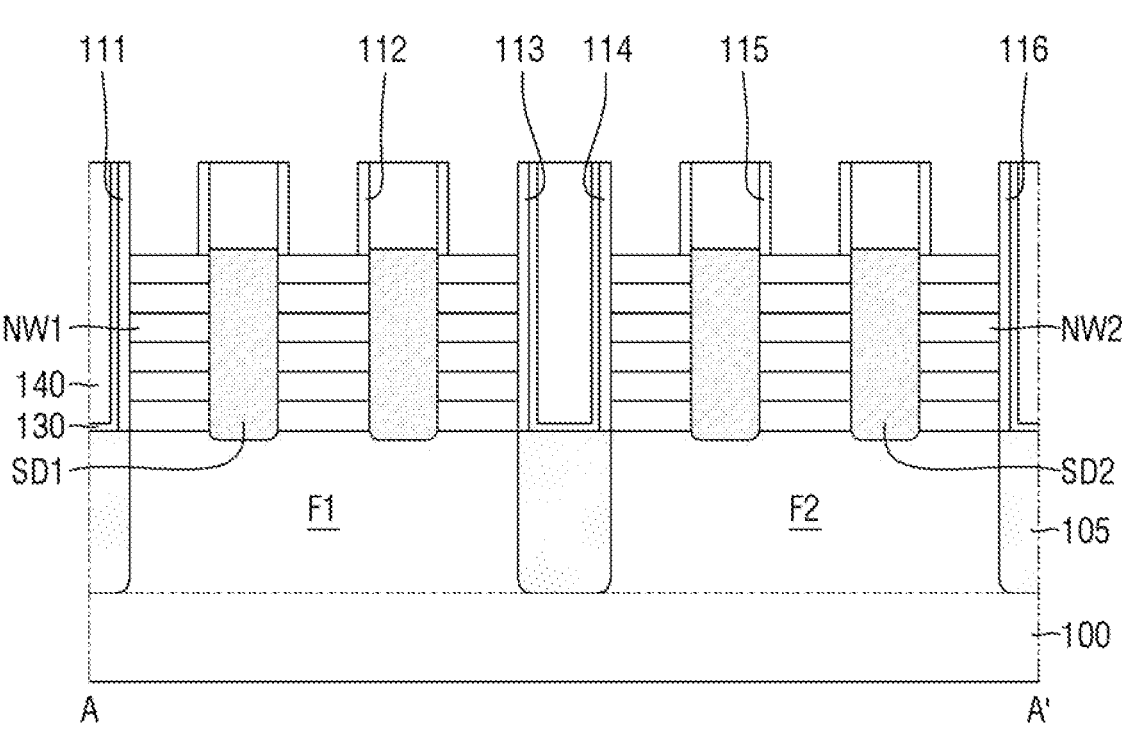
Figure 14:
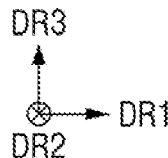
Figure 15:
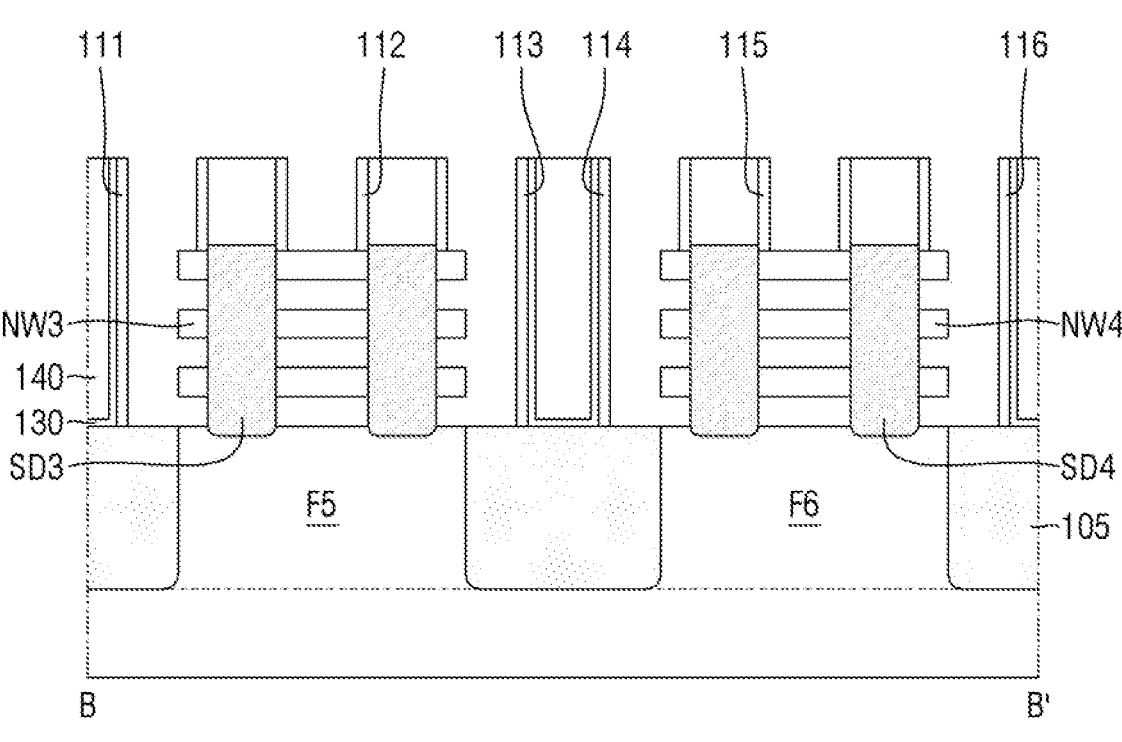
Figure 15:
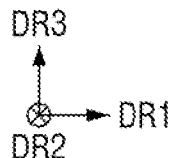

Referring to FIG. 14 and FIG. 15, the first interlayer insulating layer 140 may be formed on the first etch stop layer 130, the first to fourth source/drain regions SD1 to SD4, the first to sixth dummy gates DG1 to DG6. Subsequently, in a planarization process, a top face of each of the first to sixth dummy gates DG1 to DG6 may be exposed. Subsequently, the first to sixth dummy gates DG1 to DG6 and the first semiconductor layer 11 may be removed.

Figure 16:
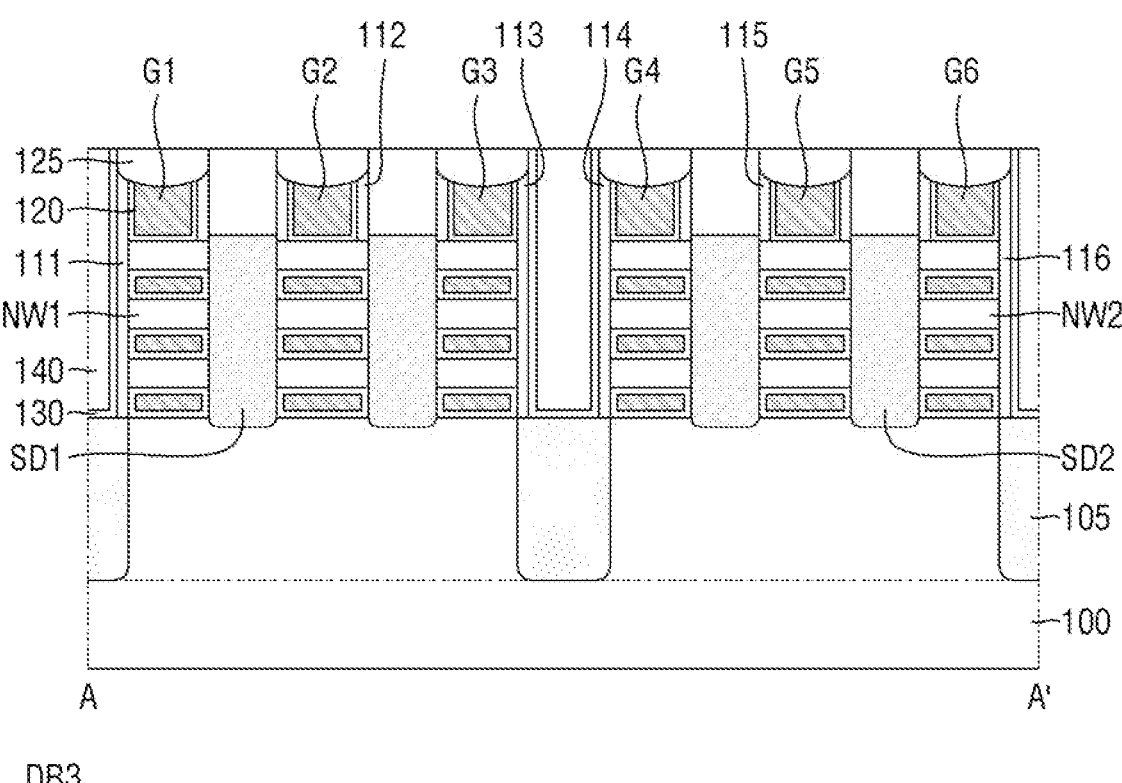
Figure 16:
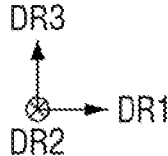
Figure 17:
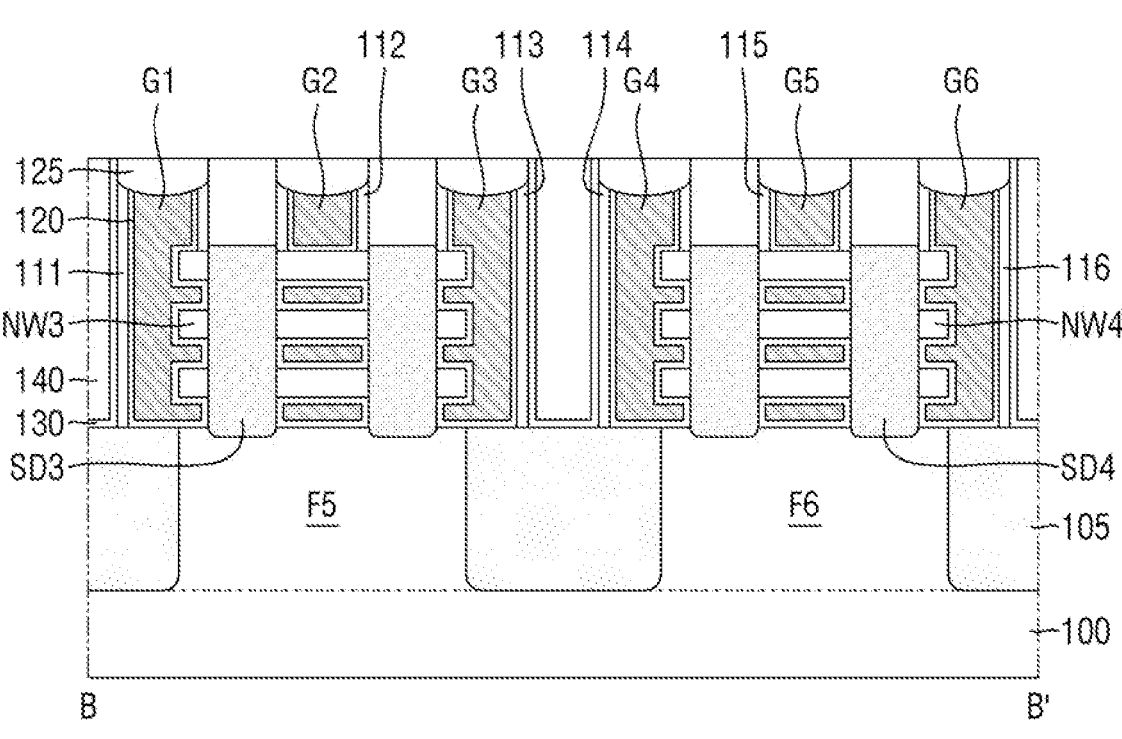
Figure 17:
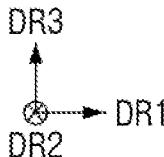

Referring to FIG. 16 and FIG. 17, the gate insulating layer 120 and the first to sixth gate electrodes G1 to G6 may be respectively formed in spaces in which and the first semiconductor layer 11 and the first to sixth dummy gates DG1 to DG6 have been removed. Subsequently, the capping pattern 125 may be formed on the first to sixth gate spacers 111 to 116 and the first to sixth gate electrodes G1 to G6.

Referring to FIG. 2 to FIG. 4, the source/drain contact CA may be formed so as to extend through the first interlayer insulating layer 140 in the vertical direction DR3 and thus to be connected to any one of the first to fourth source/drain regions SD1 to SD4. Further, the gate contact CB may be formed so as to extend through the capping pattern 125 in the vertical direction DR3 and thus to be connected to any one of the first to sixth gate electrodes G1 to G6.

Subsequently, the second etch stop layer 150 and the second interlayer insulating layer 160 may be sequentially formed on a top face of each of the first interlayer insulating layer 140, the capping pattern 125, the source/drain contact CA, and the gate contact CB.

Subsequently, the first via V1 may be formed to extend through the second interlayer insulating layer 160 and the second etch stop layer 150 in the vertical direction DR3, and to be connected to the source/drain contact CA. Further, the second via V2 may be formed to extend through the second interlayer insulating layer 160 and the second etch stop layer 150 in the vertical direction DR3, and to be connected to the gate contact CB. In this manufacturing process, the semiconductor device shown in FIG. 2 to FIG. 4 may be manufactured.

Hereinafter, a semiconductor device according to some further example embodiments will be described with reference to FIG. 18 and FIG. 19. A following description is based on differences between the semiconductor device of FIG. 18 and FIG. 19 and the semiconductor device shown in FIG. 1 to FIG. 4.

Figure 18:
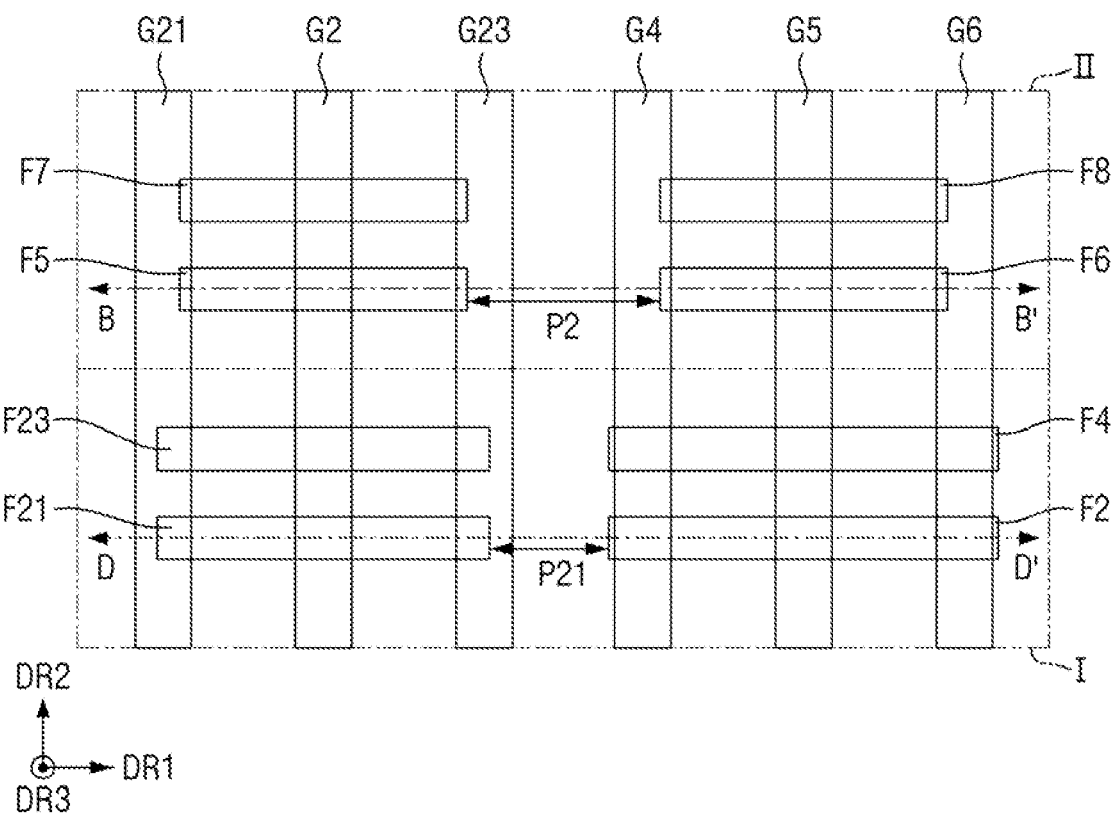
FIG. 18 is a layout diagram for illustrating a semiconductor device according to some further example embodiments.

FIG. 18 is a layout diagram for illustrating a semiconductor device according to some further example embodiments. FIG. 19 is a cross-sectional view taken along a line D-D' in FIG. 18.

Figure 19:
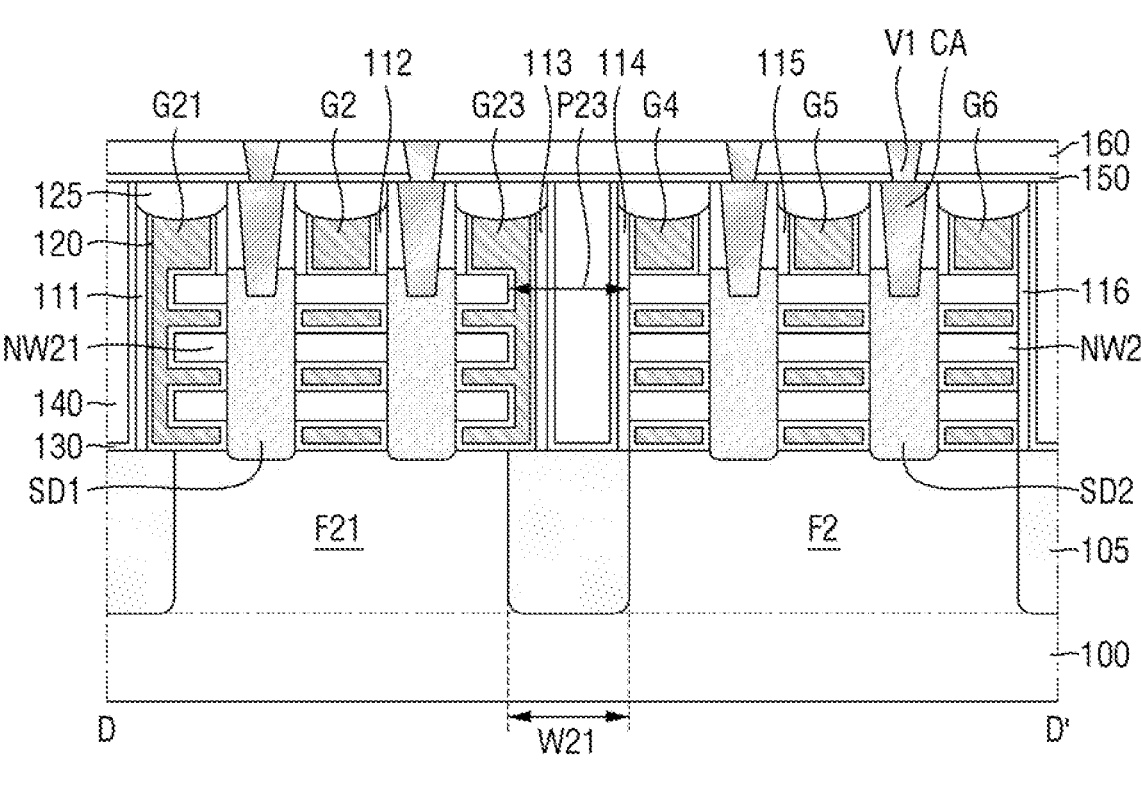
FIG. 19 is a cross-sectional view taken along a line D-D' in FIG. 18.
Figure 19:
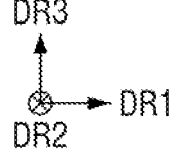

Referring to FIG. 18 and FIG. 19, in the semiconductor device according to some further example embodiments, at least a part of a third gate electrode G23 may be disposed on the field insulating layer 105 and between a first active pattern F21 and the second active pattern F2. Further, at least a part of the third gate electrode G23 may be disposed on the field insulating layer 105 and between a third active pattern F23 and the fourth active pattern F4.

A first pitch P21 in the first horizontal direction DR1 between the first active pattern F21 and the second active pattern F2 may be smaller than the second pitch P2 in the first horizontal direction DR1 between the fifth active pattern F5 and the sixth active pattern F6.

A third pitch P23 in the first horizontal direction DR1 between a first plurality of nanosheets NW21 and the second plurality of nanosheets NW2 may be smaller than the fourth pitch (P4 of FIG. 3) in the first horizontal direction of the DR1 between the third plurality of nanosheets (NW3 of FIG. 3) and the fourth plurality of nanosheets (NW4 of FIG. 3).

A first width W21 in the first horizontal direction DR1 of a portion of the field insulating layer 105 disposed between the first active pattern F21 and the second active pattern F2 may be smaller than the second width (W2 of FIG. 3) in the first horizontal direction DR1 of a portion of the field insulating layer 105 disposed between the fifth active pattern (F5 of FIG. 3) and the sixth active pattern (F6 of FIG. 3).

At least a part of the first gate electrode G21 may be disposed on a portion of the field insulating layer 105 disposed on the first sidewall of each of the first and third active patterns F21 and F23. The first gate electrode G21 may entirely surround one end portion of the first plurality of nanosheets NW21. A third gate electrode G23 may entirely surround the other end portion of the first plurality of nanosheets NW21.

Hereinafter, a semiconductor device according to some further example embodiments will be described with reference to FIG. 20 and FIG. 21. A following description is based on differences between the semiconductor device of FIG. 20 and FIG. 21 and the semiconductor device shown in FIG. 1 to FIG. 4.

Figure 20:
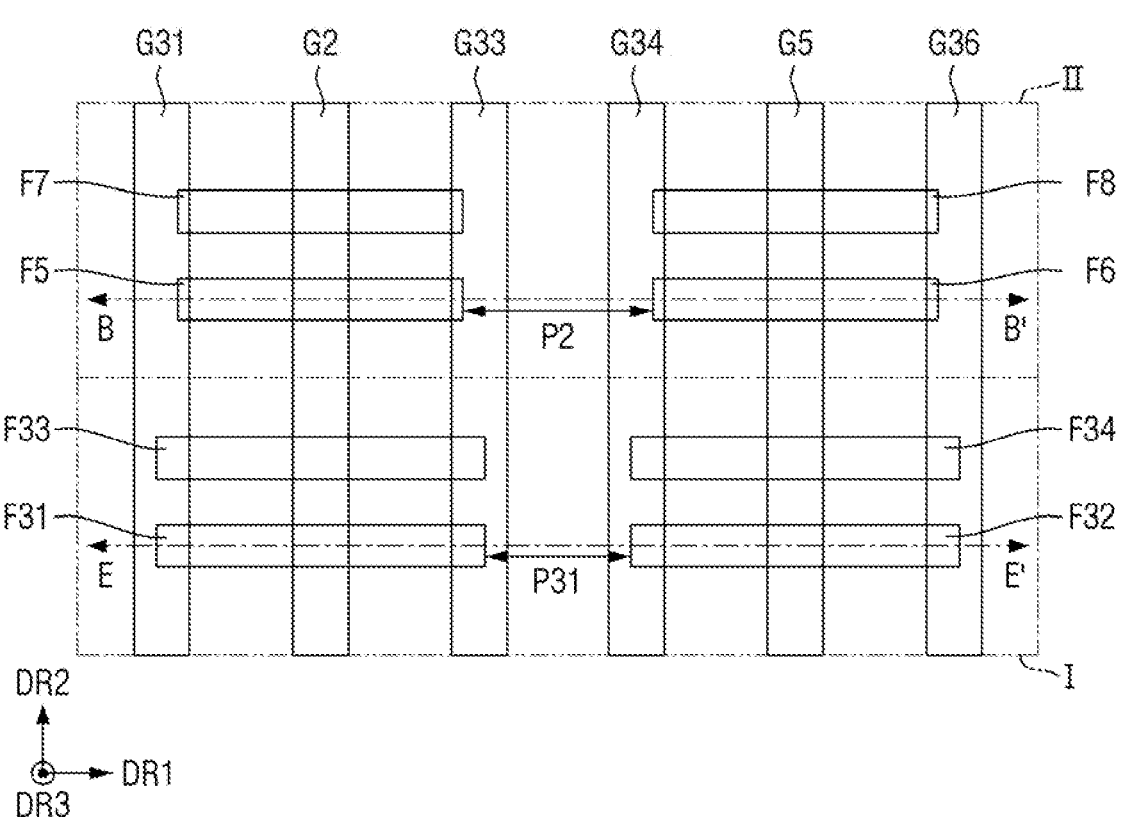
FIG. 20 is a layout diagram for illustrating a semiconductor device according to some further example embodiments.

FIG. 20 is a layout diagram for illustrating a semiconductor device according to some further example embodiments. FIG. 21 is a cross-sectional view taken along a line E-E' in FIG. 20.

Figure 21:
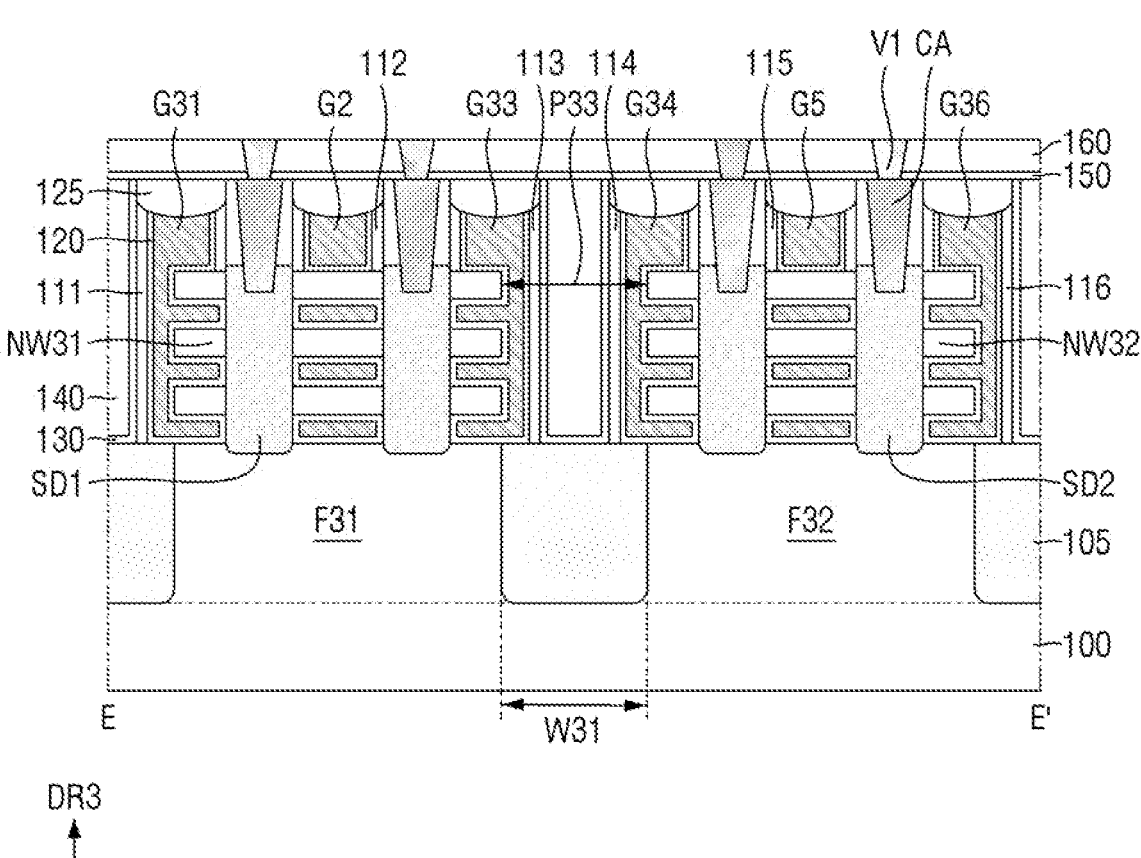
FIG. 21 is a cross-sectional view taken along a line E-E' in FIG. 20.

Referring to FIG. 20 and FIG. 21, in a semiconductor device according to some further example embodiments, each of at least a part of a third gate electrode G33 and at least a part of a fourth gate electrode G34 may be disposed on the field insulating layer 105 and between a first active pattern F31 and a second active pattern F32. Further, each of at least a part of the third gate electrode G33 and at least a part of the fourth gate electrode G34 may be disposed on the field insulating layer 105 and between a third active pattern F33 and a fourth active pattern F34.

A first pitch P31 in the first horizontal direction DR1 between the first active pattern F31 and the second active pattern F32 may be smaller than the second pitch P2 in the first horizontal direction DR1 between the fifth active pattern F5 and the sixth active pattern F6.

A third pitch P33 in the first horizontal direction DR1 between a first plurality of nanosheets NW31 and a second plurality of nanosheets NW32 may be smaller than the fourth pitch (P4 of FIG. 3) in the first horizontal direction of the DR1 between the third plurality of nanosheets (NW3 of FIG. 3) and the fourth plurality of nanosheets (NW4 of FIG. 3).

A first width W31 in the first horizontal direction DR1 of a portion of the field insulating layer 105 disposed between the first active pattern F31 and the second active pattern F32 may be smaller than the second width (W2 of FIG. 3) of a portion of the field insulating layer 105 disposed between the fifth active pattern (F5 of FIG. 3) and the sixth active pattern (F6 of FIG. 3).

At least a part of a first gate electrode G31 may be disposed on a portion of the field insulating layer 105 disposed on the first sidewall of each of the first and third active patterns F31 and F33. The first gate electrode G31 may entirely surround one end portion of the first plurality of nanosheets NW31. A third gate electrode G33 may entirely surround the other end portion of the first plurality of nanosheets NW31.

Further, at least a part of the sixth gate electrode G36 may be disposed on a portion of the field insulating layer 105 disposed on the second sidewall of each of the second and fourth active patterns F32 and F34. A fourth gate electrode G34 may entirely surround one end portion of the second plurality of nanosheets NW32. A sixth gate electrode G36 may entirely surround the other end portion of the second plurality of nanosheets NW32.

Hereinafter, a semiconductor device according to some further example embodiments will be described with reference to FIG. 22 and FIG. 23. A following description is based on differences between the semiconductor device of FIG. 22 and FIG. 23 and the semiconductor device shown in FIG. 1 to FIG. 4.

Figure 22:
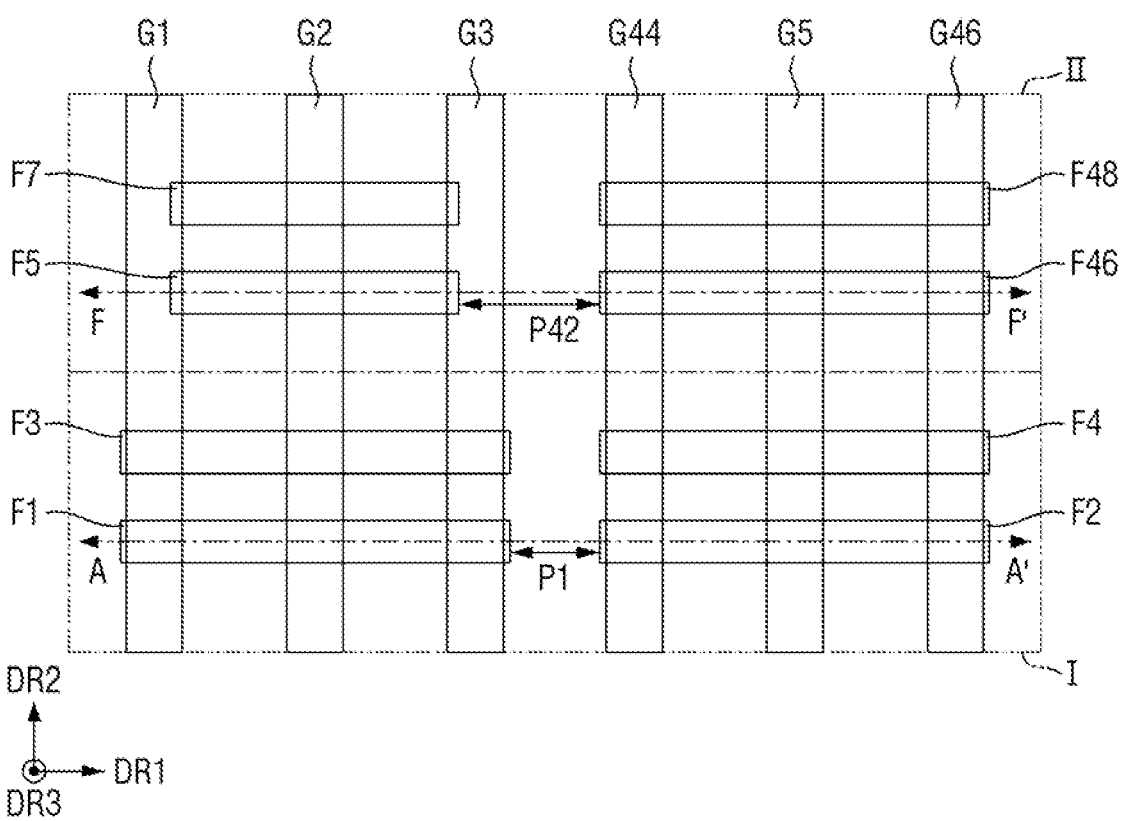
FIG. 22 is a layout diagram for illustrating a semiconductor device according to some further example embodiments.

FIG. 22 is a layout diagram for illustrating a semiconductor device according to some further example embodiments. FIG. 23 is a cross-sectional view taken along a line F-F' in FIG. 22.

Figure 23:
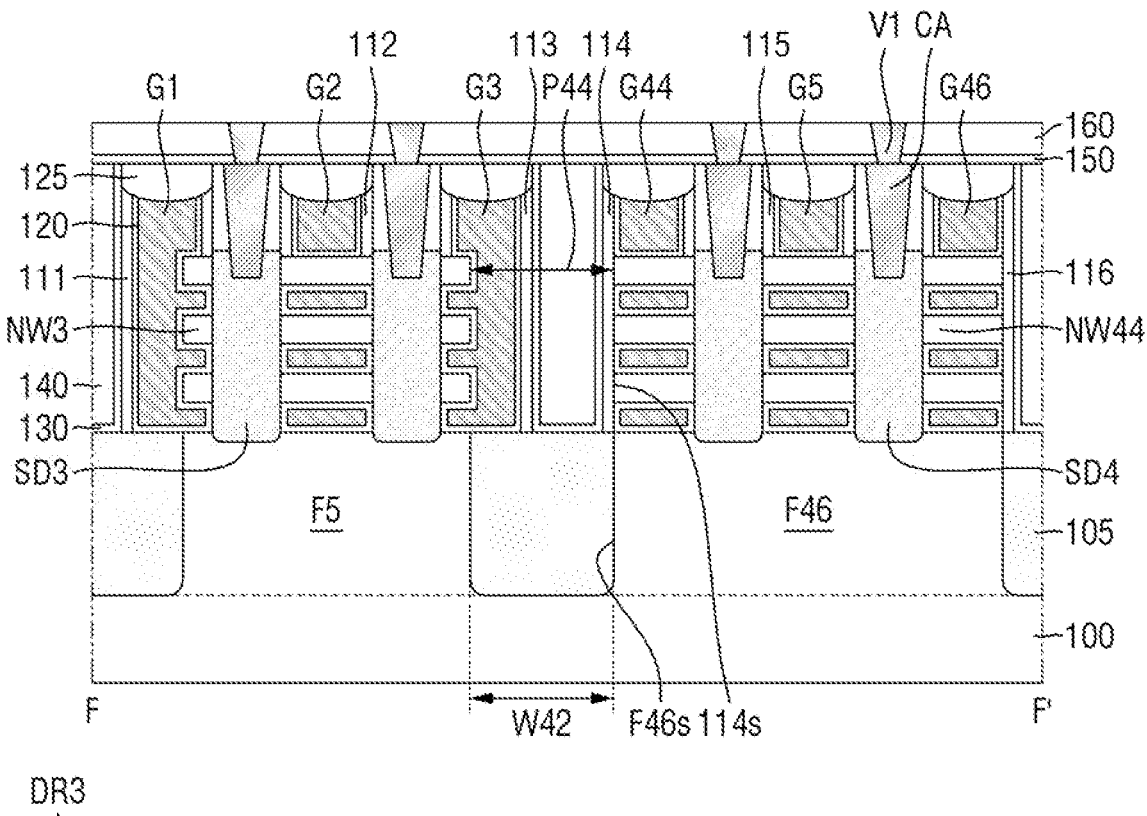
FIG. 23 is a cross-sectional view taken along a line F-F' in FIG. 22.
Figure 23:
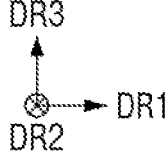

Referring to FIG. 22 and FIG. 23, in the semiconductor device according to some further example embodiments, a fourth gate electrode G44 may not be disposed on the field insulating layer 105 and between the fifth active pattern F5 and a sixth active pattern F46. Further, the fourth gate electrode G44 may not be disposed on the field insulating layer 105 and between the seventh active pattern F7 and an eighth active pattern F48.

The first pitch P1 in the first horizontal direction DR1 between the first active pattern F1 and the second active pattern F2 may be smaller than a second pitch P42 in the first horizontal direction DR1 between the fifth active pattern F5 and the sixth active pattern F46.

The third pitch (P3 of FIG. 2) in the first horizontal direction DR1 between the first plurality of nanosheets (NW1 of FIG. 2) and the second plurality of nanosheets (NW2 of FIG. 2) may be smaller than a fourth pitch P44 in the first horizontal direction DR1 between the third plurality of nanosheets NW3 and a fourth plurality of nanosheets NW44.

The first width W1 in the first horizontal direction DR1 of a portion of field insulating layer 105 disposed between the first active pattern (F1 of FIG. 2) and the second active pattern (F2 of FIG. 2) may be smaller than a second width W42 in the first horizontal direction DR1 of a portion of the field insulating layer 105 disposed between the fifth active pattern F5 and the sixth active the pattern F46.

A sixth gate electrode G46 may not be disposed on a portion of the field insulating layer 105 disposed on the second sidewall of each of the sixth and eighth active patterns F46 and F48. The fourth gate spacer 114 disposed on a first sidewall of a fourth gate electrode G44 may contact a first sidewall of the fourth plurality of nanosheets NW44. Further, the sixth gate spacer 116 disposed on a second sidewall of the sixth gate electrode G46 may contact a second sidewall of the fourth plurality of nanosheets NW44.

A sidewall 114s of the fourth gate spacer 114 that is in contact with the first sidewall of the fourth plurality of nanosheets NW44 may be aligned with a first sidewall F46s of each of the sixth and eighth active patterns F46 and F48 in the vertical direction DR3. Further, a sidewall of the sixth gate spacer 116 that is in contact with the second sidewall of the fourth plurality of nanosheets NW44 may be aligned with a second sidewall of each of the sixth and eighth active patterns F46 and F48 in the vertical direction DR3.

Hereinafter, a semiconductor device according to some further example embodiments will be described with reference to FIG. 24. A following description is based on differences between the semiconductor device of FIG. 24 and the semiconductor devices shown in FIG. 20 and FIG. 22.

Figure 24:
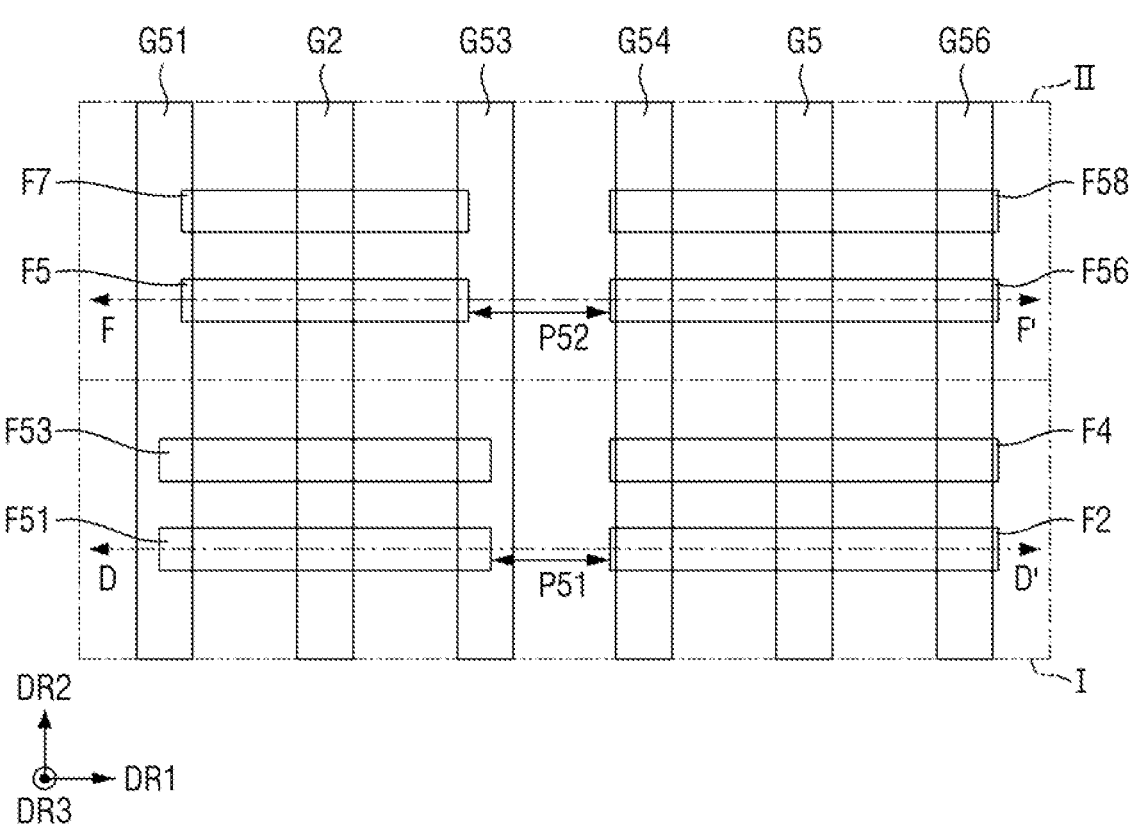
FIG. 24 is a layout diagram for illustrating a semiconductor device according to some further example embodiments.

FIG. 24 is a layout diagram for illustrating a semiconductor device according to some further example embodiments.

Referring to FIG. 24, the semiconductor device according to some further example embodiments may include first to eighth active patterns F51, F2, F53, F4, F5, F56, F7, and F58, and first to sixth gate electrodes G51, G2, G53, G54, G5, and G56.

The first active pattern F51, the third active pattern F53, the fifth active pattern F5, seventh active pattern F7, the first gate electrode G51, the second gate electrode G2 and the third gate electrode G53 may have the same structures as those of the first active pattern F31, the third active pattern F33, the fifth active pattern F5, the seventh active pattern F7, the first gate electrode G31, the second gate electrode G2 and the third gate electrode G33 of the semiconductor device as shown in FIG. 20, respectively. Therefore, a detailed description thereof will be omitted.

Further, the second active pattern F2, the fourth active pattern F4, the sixth active pattern F56, eighth active pattern F58, the fourth gate electrode G54, the fifth gate electrode G5 and the sixth gate electrode G56 may have the same structures as those of the second active pattern F2, the fourth active pattern F4, the sixth active pattern F46, eighth active pattern F48, the fourth gate electrode G44, the fifth gate electrode G5 and the sixth gate electrode G46 of the semiconductor device as shown in FIG. 22, respectively. Therefore, a detailed description thereof will be omitted.

A first pitch P51 in the first horizontal direction DR1 between the first active pattern F51 and the second active pattern F2 may be smaller than a second pitch P52 in the first horizontal direction DR1 between the fifth active pattern F5 and the sixth active pattern F56.

As described above, embodiments relate to a semiconductor device including a MBCFET™ (Multi-Bridge Channel Field Effect Transistor).

Embodiments may provide a semiconductor device with improved reliability, in which a pitch between active patterns in a NMOS region is smaller than a pitch between active patterns in a PMOS region, and at least a part of the gate electrode in the PMOS region is formed to cover sidewalls of a plurality of nanosheets.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a first active pattern extending in a first horizontal direction;
a second active pattern extending in the first horizontal direction and spaced apart from the first active pattern in the first horizontal direction;

a third active pattern extending in the first horizontal direction and spaced apart from the first active pattern in a second horizontal direction different from the first horizontal direction;
a fourth active pattern extending in the first horizontal direction and spaced apart from the third active pattern in the first horizontal direction;
a field insulating layer surrounding a sidewall of each of the first to fourth active patterns;
a first plurality of nanosheets, a second plurality of nanosheets, a third plurality of nanosheets, and a fourth plurality of nanosheets respectively disposed on the first to fourth active patterns;
a first gate electrode extending in the second horizontal direction, intersecting each of the first and third active patterns, and surrounding each of the first and third plurality of nanosheets;
a second gate electrode extending in the second horizontal direction, intersecting each of the second and fourth active patterns, and surrounding each of the second and fourth plurality of nanosheets, wherein:
a first pitch in the first horizontal direction between the first active pattern and the second active pattern is smaller than a second pitch in the first horizontal direction between the third active pattern and the fourth active pattern,
at least a part of the first gate electrode is disposed on a portion of the field insulating layer between the third active pattern and the fourth active pattern, and
a width of the first gate electrode in the first horizontal direction of a portion overlapping the first plurality of nanosheets in the first horizontal direction is smaller than a width of the first gate electrode in the first horizontal direction of a portion overlapping the third plurality of nanosheets in the first horizontal direction.

2. The semiconductor device as claimed in claim 1, wherein a third pitch in the first horizontal direction between the first plurality of nanosheets and the second plurality of nanosheets is smaller than a fourth pitch in the first horizontal direction between the third plurality of nanosheets and the fourth plurality of nanosheets.

3. The semiconductor device according to claim 1, wherein a first width in the first horizontal direction of the field insulating layer disposed between the first active pattern and the second active pattern is smaller than a second width in the first horizontal direction of the field insulating layer disposed between the third active pattern and the fourth active pattern.

4. The semiconductor device as claimed in claim 1, wherein at least a part of the second gate electrode is disposed on the field insulating layer between the third active pattern and the fourth active pattern.

5. The semiconductor device as claimed in claim 1, wherein the second gate electrode is not disposed on the field insulating layer between the third active pattern and the fourth active pattern.

6. The semiconductor device as claimed in claim 1, wherein the second gate electrode is not disposed on the field insulating layer between the first active pattern and the second active pattern.

7. The semiconductor device as claimed in claim 6, wherein the first gate electrode is not disposed on the field insulating layer between the first active pattern and the second active pattern.

8. The semiconductor device as claimed in claim 1, wherein at least a part of the first gate electrode is disposed on the field insulating layer between the first active pattern and the second active pattern.

9. The semiconductor device as claimed in claim 8, wherein at least a part of the second gate electrode is disposed on the field insulating layer between the first active pattern and the second active pattern.

10. The semiconductor device as claimed in claim 1, wherein the first and the second active patterns are disposed in an NMOS region, and the third and fourth active patterns are disposed in a PMOS region.

11. A semiconductor device, comprising:

a first active pattern extending in a first horizontal direction;

a second active pattern extending in the first horizontal direction and spaced apart from the first active pattern in the first horizontal direction;

a third active pattern extending in the first horizontal direction and spaced apart from the first active pattern in a second horizontal direction different from the first horizontal direction;

a fourth active pattern extending in the first horizontal direction and spaced apart from the third active pattern in the first horizontal direction;

a field insulating layer surrounding a sidewall of each of the first to fourth active patterns;

a first plurality of nanosheets, a second plurality of nanosheets, a third plurality of nanosheets, and a fourth plurality of nanosheets respectively disposed on the first to fourth active patterns;

a first gate electrode extending in the second horizontal direction, intersecting each of the first and third active patterns, and surrounding each of the first and third plurality of nanosheets;

a second gate electrode extending in the second horizontal direction, intersecting each of the second and fourth active patterns, and surrounding each of the second and fourth plurality of nanosheets;

a first gate spacer disposed on each of both opposing sidewalls of the first gate electrode and extending in the second horizontal direction; and a second gate spacer disposed on each of both opposing sidewalls of the second gate electrode and extending in the second horizontal direction, wherein:

a first width in the first horizontal direction of the field insulating layer disposed between the first active pattern and the second active pattern is smaller than a second width in the first horizontal direction of the field insulating layer disposed between the third active pattern and the fourth active pattern, a first pitch in the first horizontal direction between the first plurality of nanosheets and the second plurality of nanosheets is smaller than a second pitch in the first horizontal direction between the third plurality of nanosheets and the fourth plurality of nanosheets, and a width of the first gate electrode in the first horizontal direction of a portion overlapping the first plurality of nanosheets in the first horizontal direction is smaller than a width of the first gate electrode in the first horizontal direction of a portion overlapping the third plurality of nanosheets in the first horizontal direction.

12. The semiconductor device as claimed in claim 11, wherein at least a part of the first gate electrode is disposed on the field insulating layer between the third active pattern and the fourth active pattern.

13. The semiconductor device as claimed in claim 12, wherein at least a part of the second gate electrode is disposed on the field insulating layer between the third active pattern and the fourth active pattern.

14. The semiconductor device as claimed in claim 11, wherein each of the first and second gate spacers is disposed on the field insulating layer between the first plurality of nanosheets and the second plurality of nanosheets and on the field insulating layer between the third plurality of nanosheets and the fourth plurality of nanosheets.

15. The semiconductor device as claimed in claim 11, wherein, in a region between the first active pattern and the second active pattern, one sidewall of the second gate spacer facing the second gate electrode is aligned with a sidewall of the second active pattern in a vertical direction perpendicular to the first and second horizontal directions.

16. The semiconductor device as claimed in claim 11, wherein, in a region between the third active pattern and the fourth active pattern, one sidewall of the second gate spacer facing the second gate electrode is aligned with a sidewall of the fourth active pattern in a vertical direction perpendicular to the first and second horizontal directions.

17. The semiconductor device as claimed in claim 11, wherein at least a part of the first gate electrode is disposed on the field insulating layer between the first active pattern and the second active pattern.

18. The semiconductor device as claimed in claim 17, wherein at least a part of the second gate electrode is disposed on the field insulating layer between the first active pattern and the second active pattern.

19. The semiconductor device as claimed in claim 11, wherein the second gate spacer is in contact with a sidewall of the second plurality of nanosheets between the first plurality of nanosheets and the second plurality of nanosheets.

20. A semiconductor device, comprising:

a substrate having an NMOS region and a PMOS region defined therein;

a first active pattern extending in a first horizontal direction and disposed on the NMOS region;

a second active pattern extending in the first horizontal direction and disposed on the NMOS region, wherein the second active pattern is spaced apart from the first active pattern in the first horizontal direction;

a third active pattern extending in the first horizontal direction and disposed on the PMOS region, wherein the third active pattern is spaced apart from the first active pattern in a second horizontal direction different from the first horizontal direction;

a fourth active pattern extending in the first horizontal direction and disposed on the PMOS region, wherein the fourth active pattern is spaced apart from the third active pattern in the first horizontal direction;

a field insulating layer surrounding a sidewall of each of the first to fourth active patterns;

a first plurality of nanosheets, a second plurality of nanosheets, a third plurality of nanosheets, and a fourth plurality of nanosheets respectively disposed on the first to fourth active patterns;

a first gate electrode extending in the second horizontal direction, intersecting each of the first and third active patterns, and surrounding each of the first and third plurality of nanosheets; and a second gate electrode extending in the second horizontal direction, intersecting each of the second and fourth active patterns, and surrounding each of the second and fourth plurality of nanosheets, wherein:

a first pitch in the first horizontal direction between the first active pattern and the second active pattern is smaller than a second pitch in the first horizontal direction between the third active pattern and the fourth active pattern, a third pitch in the first horizontal direction between the first plurality of nanosheets and the second plurality of nanosheets is smaller than a fourth pitch in the first horizontal direction between the third plurality of nanosheets and the fourth plurality of nanosheets, each of the first gate electrode and the second gate electrode is not disposed on the field insulating layer between the first active pattern and the second active pattern, and each of at least a part of the first gate electrode and at least a part of the second gate electrode is disposed on the field insulating layer between the third active pattern and the fourth active pattern, and a width of the first gate electrode in the first horizontal direction of a portion overlapping the first plurality of nanosheets in the first horizontal direction is smaller than a width of the first gate electrode in the first horizontal direction of a portion overlapping the third plurality of nanosheets in the first horizontal direction.

* * * * *